United States Patent
Hasegawa et al.

(10) Patent No.: US 10,753,551 B2
(45) Date of Patent: Aug. 25, 2020

(54) ELECTRONIC COMPONENT, ELECTRONIC COMPONENT MOUNTING SUBSTRATE, AND ELECTRONIC COMPONENT MOUNTING METHOD TO FACILITATE POSITIONAL ALIGNMENT BETWEEN THE ELECTRONIC COMPONENT AND THE MOUNTING SUBSTRATE

(71) Applicant: Sony Semiconductor Solutions Corporation, Kanagawa (JP)

(72) Inventors: Toshiaki Hasegawa, Kanagawa (JP); Kenichi Aoyagi, Kanagawa (JP); Yoshiya Hagimoto, Kanagawa (JP); Nobutoshi Fujii, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 159 days.

(21) Appl. No.: 15/554,872

(22) PCT Filed: Jan. 27, 2016

(86) PCT No.: PCT/JP2016/052341
§ 371 (c)(1),
(2) Date: Aug. 31, 2017

(87) PCT Pub. No.: WO2016/143403
PCT Pub. Date: Sep. 15, 2016

(65) Prior Publication Data
US 2018/0045383 A1 Feb. 15, 2018

(30) Foreign Application Priority Data
Mar. 10, 2015 (JP) ................. 2015-047002

(51) Int. Cl.
*H05K 1/18* (2006.01)
*H05K 3/34* (2006.01)
(Continued)

(52) U.S. Cl.
CPC ............ *F21K 9/60* (2016.08); *H01L 21/6835* (2013.01); *H01L 24/00* (2013.01); *H01L 24/05* (2013.01);
(Continued)

(58) Field of Classification Search
CPC ............................. H05K 1/181; H05K 3/341
See application file for complete search history.

(56) References Cited

U.S. PATENT DOCUMENTS

2002/0100610 A1* 8/2002 Yasuda ............... H01L 24/10
174/260
2012/0256814 A1 10/2012 Ootorii

FOREIGN PATENT DOCUMENTS

JP 04-199524 A 7/1992
JP 2000-216439 A 8/2000
(Continued)

OTHER PUBLICATIONS

English equivalent machine translation of JP2008294226, retrieved on Apr. 22, 2020 from European Patent Office (Year: 2020).*
(Continued)

*Primary Examiner* — Suezu Ellis
(74) *Attorney, Agent, or Firm* — Wolf, Greenfield & Sacks, P.C.

(57) ABSTRACT

An electronic component mounting substrate 10A is configured of an electronic component 20, and a mounting substrate 10 mounting the electronic component 20 thereon, in which concave parts 24 are formed on a mounting surface 23 of the electronic component 20 opposite to the mounting substrate 10, a connection part 39 is exposed at the bottom of the concave part 24, and electronic component attachment parts 12 provided on the mounting substrate 10 are soldered to the connection parts 39 provided in the electronic component 20.

5 Claims, 19 Drawing Sheets

(51) Int. Cl.
*H01L 23/00* (2006.01)
*F21K 9/60* (2016.01)
*H01L 21/683* (2006.01)
*H01L 25/18* (2006.01)
*H01L 25/04* (2014.01)
*F21Y 113/13* (2016.01)
*F21Y 115/10* (2016.01)

(52) U.S. Cl.
CPC .............. H01L 24/16 (2013.01); H01L 24/81 (2013.01); H01L 25/04 (2013.01); H01L 25/18 (2013.01); H05K 1/181 (2013.01); H05K 3/341 (2013.01); H05K 3/3436 (2013.01); H05K 3/3489 (2013.01); *F21Y 2113/13* (2016.08); *F21Y 2115/10* (2016.08); *H01L 24/13* (2013.01); *H01L 24/97* (2013.01); *H01L 2221/68354* (2013.01); *H01L 2221/68372* (2013.01); *H01L 2224/0401* (2013.01); *H01L 2224/05571* (2013.01); *H01L 2224/16225* (2013.01); *H01L 2224/16238* (2013.01); *H01L 2224/81005* (2013.01); *H01L 2224/81024* (2013.01); *H01L 2224/81192* (2013.01); *H01L 2224/95136* (2013.01); *H01L 2224/97* (2013.01); *H01L 2924/15192* (2013.01); *H05K 2201/09909* (2013.01); *H05K 2203/041* (2013.01); *Y02P 70/613* (2015.11)

(56) References Cited

FOREIGN PATENT DOCUMENTS

| | | | |
|---|---|---|---|
| JP | 2002-182580 A | | 6/2002 |
| JP | 2003-031853 A | | 1/2003 |
| JP | 2008294226 A | * | 12/2008 |
| JP | 2012-227514 A | | 11/2012 |

OTHER PUBLICATIONS

International Search Report and Written Opinion and English translation thereof dated Apr. 19, 2016 in connection with International Application No. PCT/JP2016/052341.

International Preliminary Report on Patentability and English translation thereof dated Sep. 21, 2017 in connection with International Application No. PCT/JP2016/052341.

\* cited by examiner

[STEP-100]

[STEP-110]

[STEP-112] (CONTINUATION)

[STEP-120]

[STEP-140]

[STEP-140] (CONTINUATION)

[STEP-140] (CONTINUATION)

[STEP-140] (CONTINUATION)

[STEP-140] (CONTINUATION)

[STEP-140] (CONTINUATION)

US 10,753,551 B2

ELECTRONIC COMPONENT, ELECTRONIC COMPONENT MOUNTING SUBSTRATE, AND ELECTRONIC COMPONENT MOUNTING METHOD TO FACILITATE POSITIONAL ALIGNMENT BETWEEN THE ELECTRONIC COMPONENT AND THE MOUNTING SUBSTRATE

CROSS-REFERENCE TO RELATED APPLICATIONS

This application claims the benefit under 35 U.S.C. § 371 as a U.S. National Stage Entry of International Application No. PCT/JP2016/052341, filed in the Japanese Patent Office as a Receiving Office on Jan. 27, 2016, which claims priority to Japanese Patent Application Number JP2015-047002, filed in the Japanese Patent Office on Mar. 10, 2015, each of which is hereby incorporated by reference in its entirety.

TECHNICAL FIELD

The present disclosure relates to an electronic component, an electronic component mounting substrate, and an electronic component mounting method.

BACKGROUND ART

There has been developed various methods for mounting many microelectronic components on a mounting substrate, and one of them is a transfer method (see Japanese Patent Application Laid-Open No. 2002-182580, for example). In the transfer method, many unseparated microelectronic components 220 (including light emitting diodes (LED) 232 and drive circuits 231) are arranged on a transfer substrate 240 as illustrated in a schematic partial cross-section view in FIG. 17, for example. A connection part 239 of the electronic component 220 is provided with a solder ball or solder bump 250. A planarizing film 226 covering the light emitting diodes 232 and the drive circuits 231 is adhered to the transfer substrate 240 by an adhesive layer 241. Reference numeral 221 indicates a relay substrate on which various circuits or wirings 235, 238 are formed. The electronic component 220 in the state is then separated into the state as illustrated in FIG. 18. A resist layer having an opening at which a separation groove 242 is to be formed is formed on the relay substrate 221 in order to separate the electronic component 220. The separation groove 242 is then formed by etching the relay substrate 221 and the electronic component 220 in a dry etching method using the resist layer as etching mask, thereby separating the electronic component 220.

The separated electronic components 220 are then placed on flux above electronic component attachment parts of the flux-applied mounting substrate, and then the solder balls or solder bumps 250 are melted thereby to solder the electronic components 220 to the electronic component attachment parts provided on the mounting substrate.

CITATION LIST

Patent Document

Patent Document 1: Japanese Patent Application Laid-Open No. 2002-182580

SUMMARY OF THE INVENTION

Problems to be Solved by the Invention

In the transfer method, there is a problem that a resist layer needs to be formed on the mounting surface of the electronic component 220 provided with the solder balls or solder bumps 250 (or on the relay substrate 221 with large irregularities) when the electronic component 220 is separated, and there is a problem that positional alignment between the electronic components 220 and the electronic component attachment parts on the mounting substrate is difficult when the electronic components 220 are placed on flux. Further, the unseparated electronic component 220 needs to be applied to the transfer substrate 240 after the electronic component 220 is manufactured as illustrated in FIG. 17, but at this time, large irregularities are caused on the surface to which the planarizing film 226 covering the light emitting diodes 232 and the drive circuits 231 is applied as illustrated in FIG. 19, and thus the large irregularities on the applied surface of the planarizing film 226 need to be planarized.

Therefore, it is a first object of the present disclosure to provide an electronic component mounting substrate in which an electronic component is mounted on a mounting substrate, and an electronic component mounting method using the electronic component and the mounting substrate, which enable the electronic components to be easily separated from each other and have a configuration and structure capable of easily performing positional alignment between the electronic component and electronic component attachment parts on the mounting substrate when soldered. Further, it is a second object of the present disclosure to provide an electronic component having a configuration and structure capable of easily performing a planarizing processing on a surface to which the electronic component is applied when the electronic component is applied to a transfer substrate after the electronic component is manufactured.

Solutions to Problems

An electronic component mounting substrate according to the present disclosure for achieving the first object includes an electronic component, and a mounting substrate mounting the electronic component thereon, in which a concave part is formed on a mounting surface of the electronic component opposite to the mounting substrate, a connection part is exposed at the bottom of the concave part, and an electronic component attachment part provided on the mounting substrate is soldered to the connection part provided in the electronic component.

An electronic component according to the present disclosure for achieving the second object includes:
a semiconductor substrate;
an electronic device; and
a drive circuit formed on the semiconductor substrate and directed for driving the electronic device,
in which the electronic device is attached in an attachment concave part formed at a part on the semiconductor substrate positioned above the drive circuit, and
the drive circuit is electrically connected to the electronic device via a connection hole formed in the semiconductor substrate.

An electronic component mounting method according to the present disclosure for achieving the first object is an electronic component mounting method for mounting an electronic component on a mounting substrate, including the steps of:

preparing an electronic component in which a concave part is formed on a mounting surface opposite to the mounting substrate and a connection part is exposed at the bottom of the concave part;

preparing the mounting substrate having an electronic component attachment part provided with a solder bump thereon and applied with flux;

placing the electronic component on the flux such that the concave part of the electronic component is positioned above the electronic component attachment part on the mounting substrate; and then melting the solder bump to solder the electronic component attachment part provided on the mounting substrate to the connection part provided in the electronic component.

Effects of the Invention

In the electronic component used in the electronic component mounting substrate according to the present disclosure or the electronic component mounting method according to the present disclosure, concave parts are formed on a mounting surface of the electronic component opposite to the mounting substrate, and a connection part is exposed at the bottom of the concave part. Therefore, when electronic component attachment parts provided on the mounting substrate are soldered to the connection parts provided in the electronic component, positional alignment between the electronic component attachment parts and the connection parts can be accurately performed with high accuracy. Additionally, solder bumps are provided on the electronic component attachment parts, thereby easily separating the electronic components from each other when the electronic components are manufactured. Further, in the electronic component according to the present disclosure, electronic devices are attached in an attachment concave part formed at a part on the semiconductor substrate positioned above the drive circuit, and thus a planarizing processing can be easily performed on the surface to which the electronic component is applied when the electronic component is applied to a transfer substrate after the electronic component is manufactured. Additionally, the electronic devices and the drive circuit are integrally provided on the semiconductor substrate, thereby achieving downsized module, thinned layers, and enhanced yield in semiconductor substrate (wafer). Additionally, the effects described in the present specification are merely exemplary and are not limitative, and additional effects may be obtained.

MODE FOR CARRYING OUT THE INVENTION

Figure 1:
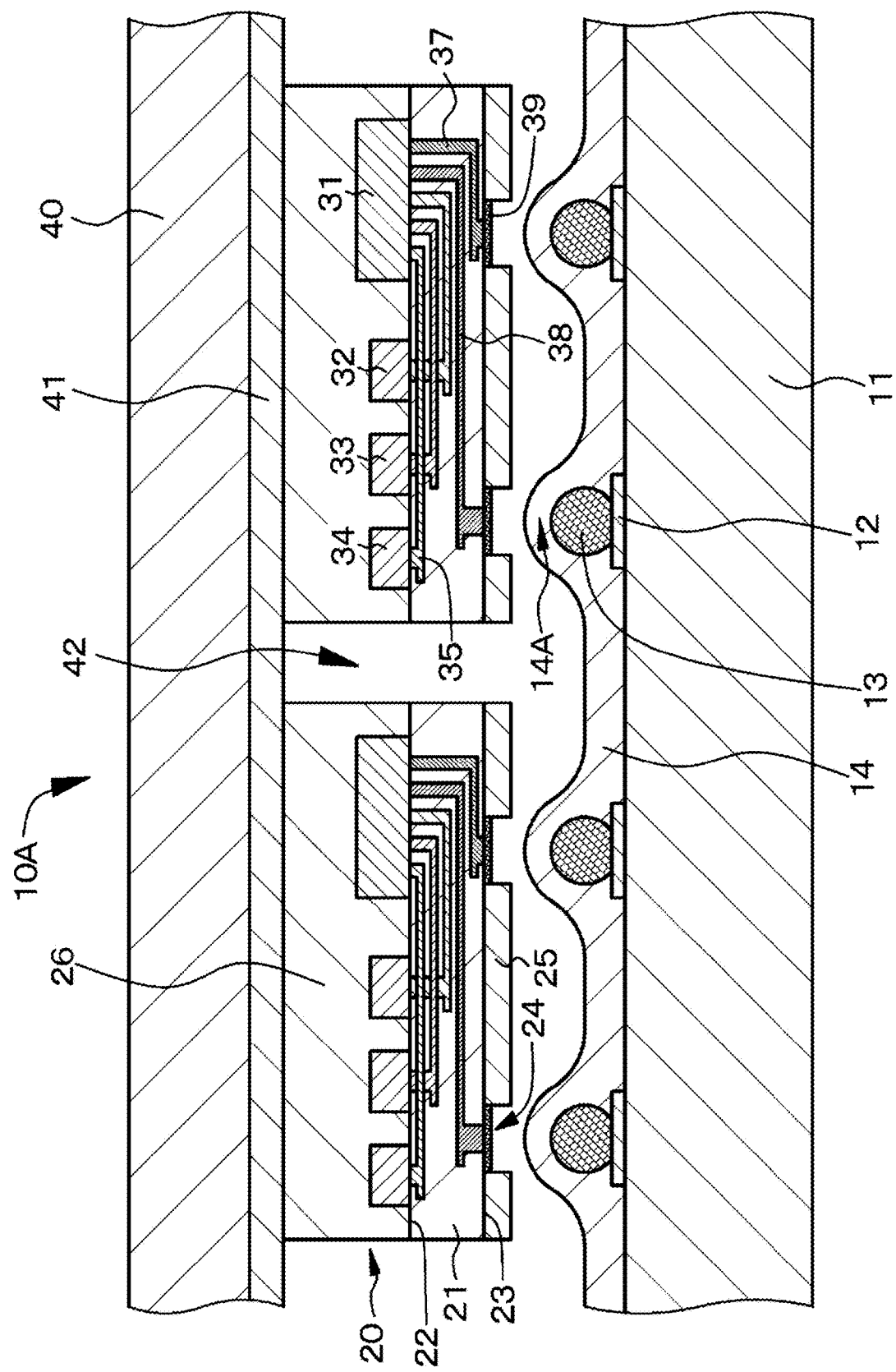
FIG. 1 is a schematic partial end view for explaining an electronic component mounting substrate according to a first embodiment.

The present disclosure will be described below according to embodiments with reference to the drawings, but the present disclosure is not limited to the embodiments, and various numerical values or materials according to the embodiments are exemplary. Additionally, the description will be made in the following order.

1. General description of electronic component, electronic component mounting substrate and electronic component mounting method according to the present disclosure
2. First embodiment (electronic component mounting substrate and electronic component mounting method according to the present disclosure)
3. Second embodiment (variant of first embodiment)
4. Third embodiment (another variant of first embodiment)
5. Fourth embodiment (still another variant of first embodiment)

6. Fifth embodiment (electronic component according to the present disclosure and still another variant of first embodiment)
7. Sixth embodiment (variant of fifth embodiment)
8. Seventh embodiment (Exemplary arrangement of electronic components according to first to sixth embodiments)
9. Others <General Description of Electronic Component, Electronic Component Mounting Substrate, and Electronic Component Mounting Method According to the Present Disclosure>

In an electronic component mounting substrate according to the present disclosure or in an electronic component mounting method according to the present disclosure, an electronic component attachment part can be soldered to a connection part provided in an electronic component via a solder bump provided on the electronic component attachment part. A method for providing a solder bump on an electronic component attachment part may be a well-known method, and a material making the solder bump may be a well-known material. It is possible to determine whether the electronic component attachment part is provided with a solder bump or whether the connection part of the electronic component is provided with a solder bump by physically or chemically analyzing the solder in the state where the electronic component attachment part is soldered to the connection part, or measuring a composition of a solder part near the interface with the electronic component attachment part and a composition of a solder part near the interface with the connection part by use of SEM, Energy Dispersive X-ray spectrometry (EDX) method, fluorescent X-ray analysis method, or the like, for example.

In the electronic component mounting substrate according to the present disclosure or the electronic component mounting method according to the present disclosure including the above preferable form, protruded parts may be provided on the mounting substrate to surround the electronic component attachment parts provided on the mounting substrate, or a convex part is provided on a part on the mounting substrate where an electronic component is mounted, and the electronic component attachment parts may be provided on the convex part, or convex parts may be provided on the mounting substrate to surround a part on the mounting substrate where an electronic component is mounted.

Further, in the electronic component mounting substrate according to the present disclosure or the electronic component mounting method according to the present disclosure including the aforementioned preferable form, an electronic component can be configured of the electronic component according to the present disclosure. That is, the electronic component includes a semiconductor substrate, electronic devices, and a drive circuit formed on the semiconductor substrate and directed for driving the electronic devices, and can be configured such that the electronic devices are attached in an attachment concave part formed on a part of the semiconductor substrate positioned above the drive circuit, and the drive circuit is electrically connected to the electronic devices via connection holes formed in the semiconductor substrate. Additionally, the electronic component in the form may be called "electronic component in the first form" as needed. A first surface of the semiconductor substrate including the electronic devices is preferably covered with an insulative material film. A material making the insulative material film may employ an organic material (specifically, such as epoxy resin, acrylic resin, polyimide resin, or silicone resin) or an inorganic material (specifically, such as silicon oxide, silicon nitride, or aluminum oxide) by way of example. The insulative material film functions as a protective film or functions also as a planarizing film. A characteristic depending on the electronic devices is required for a material making the insulative material film, and for example, in a case where the electronic devices are configured of light emitting devices or light receiving devices, transparency for lights emitted by the light emitting devices and transparency for lights received by the light receiving devices are required.

However, the electronic component is not limited to the form, and for example, includes a relay substrate (interposer) having a first surface and a second surface opposite to the first surface and corresponding to the mounting surface, electronic devices, and a semiconductor integrated circuit chip (called "IC chip") including a drive circuit for driving the electronic devices, and can be configured such that the electronic device and the IC chip are attached on the first surface, and the IC chip is electrically connected to the electronic devices via wirings formed in the relay substrate. Additionally, the electronic component in the form may be called "electronic component in the second form" as needed. Herein, the relay substrate in the electronic component in the second form may employ a printed wiring board (including rigid substrate, flexible substrate and rigid/flexible substrate, and including one-side substrate, both-side substrate, multilayered substrate, or buildup substrate, any material available), glass substrate, glass epoxy substrate, silicon substrate, polyimide substrate, or acrylic substrate, and can be manufactured in a well-known method. The electronic devices and the IC chip attached on the first surface of the relay substrate are preferably covered with a similar insulative material film to the aforementioned one.

In the electronic component according to the present disclosure or the electronic component in the first form, there can be configured such that concave parts are formed on one surface of the semiconductor substrate (called "second surface" of the semiconductor substrate) opposite to the other surface of the semiconductor substrate (called "first surface" of the semiconductor substrate) where attachment concave parts are formed, and a connection part extending from the drive circuit is exposed at the bottom of the concave part. The drive circuit is formed on the second surface of the semiconductor substrate.

In the electronic component according to the present disclosure including the above preferable form, or in the electronic component (specifically, the electronic component in the first form) in the electronic component mounting substrate according to the present disclosure or the electronic component mounting method according to the present disclosure including the aforementioned preferable form, there can be configured such that the electronic devices are configured of a red light emitting diode for emitting red light, a green light emitting diode for emitting green light, and a blue light emitting diode for emitting blue light, the drive circuit is electrically connected to the red light emitting diode via a connection hole formed in the semiconductor substrate, the drive circuit is electrically connected to the green light emitting diode via a connection hole formed in the semiconductor substrate, and the drive circuit is electrically connected to the blue light emitting diode via a connection hole formed in the semiconductor substrate. Further, in the electronic component in the second form, the electronic devices can be configured of a red light emitting diode for emitting red light, a green light emitting diode for emitting green light, and a blue light emitting diode for emitting blue light. Then in the thus-configured electronic components (the electronic component according to the present disclosure, the electronic component in the first form, and the electronic component in the second form), there can be configured such that the red light emitting diode, the green light emitting diode, and the blue light emitting diode are arranged at the vertices of a regular triangle and further the center of the regular triangle matches with the center of gravity of the drive circuit or the IC chip (which may be collectively called "drive circuit or the like" below). Additionally, the center of the regular triangle does not need to strictly match with the center of gravity of the drive circuit or the like, and assuming that the length of each side of the regular triangle as L, a distance between the center of the regular triangle and the center of gravity of the drive circuit or the like may be within 1×L, for example. Three kinds of light emitting diodes are arranged at the vertices of a regular triangle, thereby achieving uniform drive states of the three kinds of light emitting diodes by the drive circuit or the like and uniform color reproducibility, achieving reduced area of the entire electronic component, and achieving enhancement in yield. The structures and configurations of the red light emitting diode, the green light emitting diode, and the blue light emitting diode may be well-known structures and configurations. A planar shape of the entire drive circuit or the like may be any shape. The center of gravity of the drive circuit or the like is an area center of gravity derived from the planar shape of the entire drive circuit or the like. The electronic devices are configured of the light emitting diodes, thereby realizing a display device by the electronic component mounting substrate.

Furthermore, in the electronic component according to the present disclosure including the preferable form and configuration described above, or in the electronic component in the electronic component mounting substrate according to the present disclosure or the electronic component mounting method according to the present disclosure including the preferable forms and configurations described above, a light shielding film can be formed in the attachment concave part, or a light shielding film can be formed on the outer surfaces of the electronic devices, or a light shielding film can be formed on the outer surface of the IC chip. The light shielding film may be made of a material such as aluminum (Al), aluminum alloy, tungsten (W), tungsten alloy, titanium (Ti), or titanium alloy, and can be formed in various physical vapor deposition (PVD) or chemical vapor deposition (CVD) methods. The light shielding film is formed thereby to accurately prevent the drive circuit or the like from erroneously operating due to lights emitted from light emitting diodes in a case where the electronic devices are configured of the light emitting diodes, for example.

On the electronic component mounting surface opposite to the mounting substrate (specifically, the second surface of the semiconductor substrate in the electronic component in the first form or the second surface of the relay substrate in the electronic component in the second form) or on the mounting surface, various circuits or wirings are formed, and a connection part extending from the drive circuit or a connection part connected to the drive circuit or the like is specifically configured of part of the circuits or wirings or their extending part. The circuits or wirings are then covered with an insulative layer made of an insulative organic material (specifically, such as epoxy resin, acrylic resin, polyimide resin or silicone resin) or an inorganic material (specifically, such as silicon oxide, silicon nitride, or aluminum oxide). Concave parts are formed on the electronic component mounting surface (specifically, on the second surface of the semiconductor substrate in the electronic component in the first form or on the second surface of the relay substrate in the electronic component in the second form), but the concave parts can be obtained by removing the insulative layer covering the connection parts or forming the insulative layer not to cover the connection parts. Concave parts may be formed on the second surface of the semiconductor substrate or the second surface of the relay substrate as needed. Various circuits and wirings are formed also on the first surface of the relay substrate in the electronic component in the second form. The circuits and wirings can be formed in well-known methods.

The electronic devices may be general MEMS, semiconductor laser device, temperature sensor, moisture sensor, pressure sensor, or light receiving device such as imaging device other than the aforementioned light emitting diodes (LED) by way of example. The drive circuit or the like for driving the electronic devices can be a well-known drive circuit or the like depending on the electronic device and optimum for driving the electronic devices, and can be manufactured in a so-called semiconductor process.

The semiconductor substrate configuring the electronic component according to the present disclosure or the electronic component in the first form may be a silicon semiconductor substrate. Then in this case, the drive circuit is formed on the second surface of the semiconductor substrate, but the drive circuit may be formed on the semiconductor substrate on the side of the second surface of the semiconductor substrate or may be formed from the inside of the semiconductor substrate on the side of the second surface of the semiconductor substrate to the second surface, or may be formed on the second surface of the semiconductor substrate. The attachment concave part formed on the first surface of the semiconductor substrate can be formed by etching the semiconductor substrate from the first surface in the thickness direction, for example. The method for attaching the electronic devices in the attachment concave part formed in the first surface may be a connection method using adhesive fixing and plating, a connection method based on solder bumps, or the like. The connection holes in the semiconductor substrate can be formed in a through-silicon via (TSV) forming technique or a through-chip via (TCV) forming technique, for example, and the wirings and the like can be formed in well-known methods.

The mounting substrate may be a printed wiring board on which wirings, electronic component attachment parts corresponding to extending parts of the wirings or land parts, and various circuits are provided (including rigid substrate, flexible substrate, and rigid/flexible substrate and including one-side substrate, both-side substrate, multilayered substrate, or buildup substrate, any material available) byway of example, and can be manufactured in a well-known method. The wirings or electronic component attachment parts are made of copper (Cu), for example.

Protruded parts provided on the mounting substrate, a convex part provided at a part on the mounting substrate where the electronic component is mounted, or convex parts provided on the mounting substrate to surround the part on the mounting substrate where the electronic component is mounted can be made of epoxy resin, acrylic resin, polyimide resin, or silicone resin, for example, and can be formed in photolithography technique, in various printing methods including screen printing or inkjet printing, or in a combination of various application methods including a dispenser-using method and a hardening method suitable for resin to be used. Protruded parts or convex parts may be formed by use of solder resist or by use of so-called dry film or dry film resist as needed.

The protruded parts surround the electronic component attachment parts, but specifically, the protruded parts may continuously surround the electronic component attachment parts or may discontinuously surround the electronic component attachment parts. In the former case, the protruded parts may surround the electronic component attachment parts as in a wall shape. In the latter case, the protruded parts may be formed in columns or may be formed in bands. The protruded parts are formed so that flux is concaved in the region on the mounting substrate surrounded by the protruded parts (the region where the electronic component is attached) when the flux is applied on the mounting substrate. Consequently, when the electronic component is placed on the flux, the electronic component can be accurately positioned above the electronic component attachment parts due to the so-called self-alignment effect based on surface tension of the flux, and the orientation or arrangement state of the electronic component relative to the electronic component attachment parts can be optimized by optimizing a relationship between the planar shape of the protruded parts and the planar shape of the electronic component.

The electronic component attachment parts are provided on the convex part provided on the part on the mounting substrate where the electronic component is mounted, but the electronic component attachment parts correspond to the extending parts of the wirings provided on the mounting substrate, and can be formed in a plating method, for example. The size of the convex part is preferably the same as the size of the electronic component, but may be larger or smaller than the electronic component. The convex part is formed so that the flux on the convex part further protrudes than the flux on other region on the mounting substrate when the flux is applied on the mounting substrate. Consequently, when the electronic component is placed on the flux, the electronic component can be accurately positioned above the electronic component attachment parts due to the so-called self-alignment effect based on surface tension of the flux, and the orientation or arrangement state of the electronic component relative to the electronic component attachment parts can be optimized by optimizing a relationship between the planar shape of the convex part and the planar shape of the electronic component. The height of the convex part is preferably equal to or less than the height (thickness) of the solder bump or equal to or more than the thickness of the flux.

The convex parts provided on the mounting substrate to surround the part on the mounting substrate where the electronic component is mounted can be configured of a solder resist layer, for example. The convex parts are formed so that the flux is concaved in the region on the mounting substrate surrounded by the convex parts (the region where the electronic component is attached) when the flux is applied on the mounting substrate. Consequently, when the electronic component is placed on the flux, the electronic component can be accurately positioned above the electronic component attachment parts due to the so-called self-alignment effect based on surface tension of the flux, and the orientation or arrangement state of the electronic component relative to the electronic component attachment parts can be optimized by optimizing a relationship between the planar shape of the region on the mounting substrate surrounded by the convex parts and the planar shape of the electronic component. The height of the convex part is preferably equal to or less than the height (thickness) of the solder bump or equal to or more than the thickness of the flux.

A material making the flux may be a well-known material, and a method for applying the flux may be a well-known method. The method for melting the solder bump can be a well-known method. The method for placing the electronic component on the flux to position the concave parts of the electronic component above the electronic component attachment parts on the mounting substrate will be described below.

First Embodiment

Figure 2:
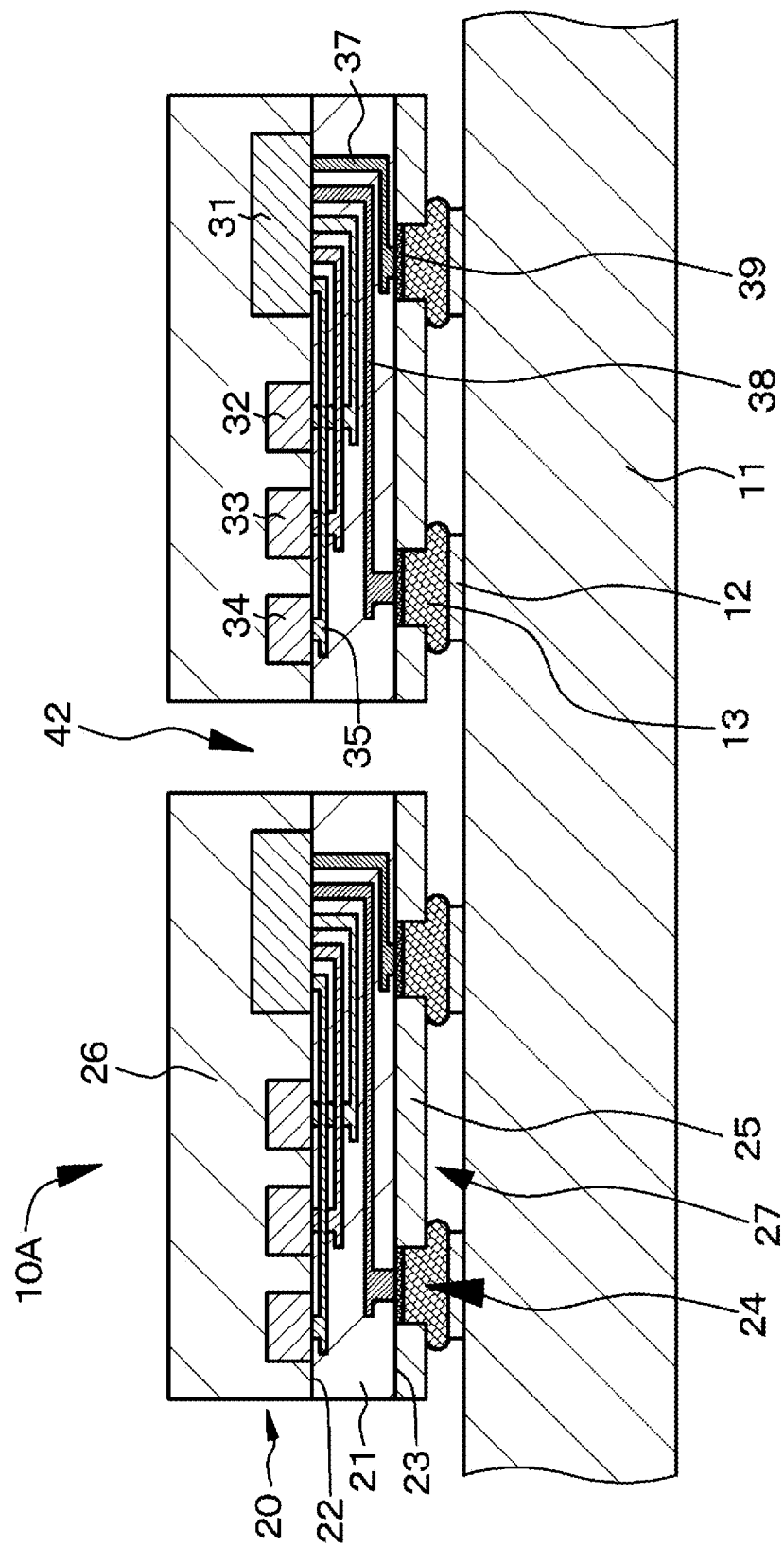
FIG. 2 is a schematic partial end view of the electronic component mounting substrate according to the first embodiment.

A first embodiment relates to the electronic component mounting substrate and the electronic component mounting method according to the present disclosure. FIG. 1 illustrates a schematic partial end view for explaining the electronic component mounting substrate according to the first embodiment, and FIG. 2 illustrates a schematic partial end view of an electronic component mounting substrate 10A according to the first embodiment. According to the first embodiment, an electronic component is configured of the electronic component in the second form. Additionally, FIG. 1 illustrates a state in which two electronic components are applied on a transfer substrate.

The electronic component mounting substrate 10A according to the first embodiment is configured of electronic components 20, and a mounting substrate 11 mounting the electronic components 20 thereon. Concave parts 24 are then formed on a mounting surface 23 of the electronic component 20 opposite to the mounting substrate 11, and a connection part 39 is exposed at the bottom of the concave part 24, and an electronic component attachment part 12 provided on the mounting substrate 11 is soldered to the connection part 39 provided in the electronic component 20.

Here, the electronic component attachment part 12 is soldered to the connection part 39 provided in the electronic component 20 via a solder bump 13 provided on the electronic component attachment part 12. The method for providing the solder bump 13 on the electronic component attachment part 12 may be a well-known method, and a material making the solder bump 13 may be a well-known material.

According to the first embodiment, the electronic component is configured of the electronic component in the second form as described above. Specifically, the electronic component 20 according to the first embodiment includes a relay substrate 21 having a first surface 22 and a second surface 23 opposite to the first surface 22 and corresponding to the mounting surface, electronic devices 32, 33, 34, and a semiconductor integrated circuit chip (IC chip) 31 including a drive circuit for driving the electronic devices 32, 33, and 34. The electronic devices 32, 33, 34 and the IC chip 31 are then soldered to be attached on the first surface 22 of the relay substrate 21, and the IC chip 31 is electrically connected to the electronic devices 32, 33, 34 via wirings 35 formed in the relay substrate 21. Further, the electronic devices 32, 33, 34 and the IC chip 31 attached on the first surface 22 are covered with an insulative material film 26. The electronic devices are configured of the red light emitting diode 32 for emitting red light, the green light emitting diode 33 for emitting green light, and the blue light emitting diode 34 for emitting a blue right. The red light emitting diode 32, the green light emitting diode 33, and the blue light emitting diode 34 are arranged at the vertices of a regular triangle, and the center of the regular triangle matches with the center of gravity of the IC chip 31. Additionally, the illustrated arrangements of the light emitting diodes in FIG. 1 to FIG. 5 are different from this arrangement for simplifying the drawings. Further, there is illustrated a state where one part (one electrode) of a light emitting diode is connected to the wiring or the like, but actually two parts (two electrodes) of a light emitting diode are connected to the wiring or the like. Various circuits and the wirings 35 are formed on the first surface 22 of the relay substrate 21, and further various circuits and wirings 38 are formed on the second surface 23 of the relay substrate 21. Then, the connection part 39 connected to the IC chip 31 is specifically configured of part of the wiring 38. The IC chip 31 is connected to the wiring 38 via a contact hole 37 provided in the relay substrate 21. The wiring 38 is covered with an insulative layer 25. The concave parts 24 are formed in the second surface 23 of the relay substrate 21, and the concave parts 24 can be obtained by removing the insulative layer 25 covering the connection parts 39 or forming the insulative layer 25 not to cover the connection parts 39.

The mounting substrate 11 is configured of a printed wiring board on which wirings (not illustrated), the electronic component attachment parts 12 corresponding to extending parts of the wirings or land parts, and various circuits (not illustrated) are provided. The wirings 35, 38 and the connection parts 39 are made of copper (Cu), for example. Further, the electronic components 20 are fixed on a transfer substrate 40 via an adhesive layer 41 in the state illustrated in FIG. 1. The electronic components 20 are mutually separated by a separation groove 42. This is applicable to the following embodiments.

The transfer method and the electronic component mounting method according to the present disclosure will be described below with reference to FIG. 11A, FIG. 11B, FIG. 12A, FIG. 12B, FIG. 13A, FIG. 13B, FIG. 14A, FIG. 14B, FIG. 15A and FIG. 15B, and the electronic component mounting method for mounting the electronic component 20 on the mounting substrate 11 according to the first embodiment includes the steps of preparing the electronic component 20 in which the concave parts 24 are formed on the mounting surface 23 opposite to the mounting substrate 11 and the connection part 39 is exposed at the bottom of the concave part 24, preparing the mounting substrate 11 having the electronic component attachment parts 12 provided with the solder bumps 13 thereon and applied with flux 14, placing the electronic component 20 on the flux 14 such that the concave parts 24 of the electronic component 20 are positioned above the electronic component attachment parts 12 on the mounting substrate 11, and then melting the solder bumps 13 thereby to solder the electronic component attachment parts 12 provided on the mounting substrate 11 to the connection parts 39 provided in the electronic component 20. Additionally, reference numeral 14A indicates a part of the flux positioned above the solder bump 13. In the following description, the electronic devices will be described by way of light emitting diodes, but the electronic devices are not limited thereto. Further, the electronic devices (light emitting diodes) 32, 33, 34 may be called light emitting diodes 100.

[Step-100]

At first, an underlayer 102, a first compound semiconductor layer 111, an active layer 113, and a second compound semiconductor layer 112 are formed on a light emitting device manufacturing substrate 101, and a second electrode 115 is formed on the second compound semiconductor layer 112 in a well-known method to be patterned. The light emitting diode 100 illustrated in FIG. 11A can be obtained in this way.

[Step-110]

Then, the light emitting diodes 100 are temporarily fixed on a first temporary fixing substrate 121 via the second electrodes 115. Specifically, the first temporary fixing substrate 121 made of a glass substrate on whose surface an adhesive layer 122 made of uncured adhesive is formed is prepared. The light emitting diodes 100 and the adhesive layer 122 are then applied to each other and the adhesive layer 122 is cured, thereby temporarily fixing the light emitting diodes 100 on the first temporary fixing substrate 121 (see FIG. 11B and FIG. 12A).

[Step-120]

Figure 12A:
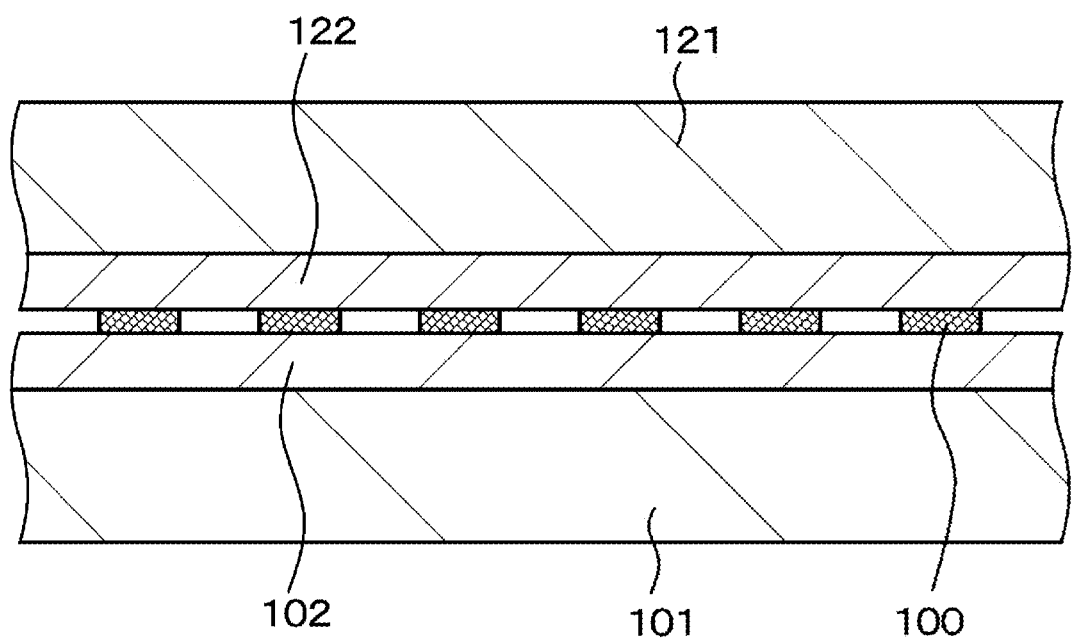
FIG. 12A and FIG. 12B are conceptual diagrams illustrating a cross-section of electronic component and the like for explaining the electronic component mounting method according to the first embodiment subsequent to FIG. 11B.
Figure 12B:
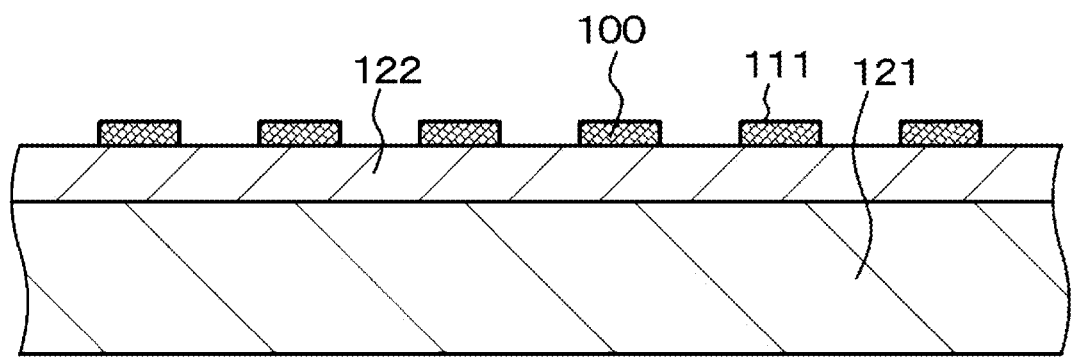

Thereafter, the light emitting diodes 100 are released from the light emitting device manufacturing substrate 101 (see FIG. 12B). Specifically, the light emitting device manufacturing substrate 101 is thinned from the backside in a wrapping processing and then the light emitting device manufacturing substrate 101 and the underlayer 102 are wet-etched thereby to remove the light emitting device manufacturing substrate 101 and the underlayer 102 and to expose the first compound semiconductor layer 111.

Additionally, a material making the first temporary fixing substrate 121 may be metal plate, alloy plate, ceramic plate, or plastic plate other than glass substrate. The method for temporarily fixing the light emitting diodes to the first temporary fixing substrate 121 may be metal joining method, semiconductor joining method, or metal/semiconductor joining method other than adhesive-using method. Further, the method for removing the light emitting device manufacturing substrate 101 or the like from the light emitting diodes can be laser/abrasion method or heating method other than etching method.

[Step-130]

A first electrode 114 is then formed at the bottom of the exposed first compound semiconductor layer 111 in a so-called lift-off method.

[Step-140]

The relay substrate 21 is prepared in which a second temporary fixing substrate 131 forming a slightly-viscous layer 132 made of silicone rubber thereon and alignment marks (not illustrated) made of metal thin film are previously formed at predetermined positions and on whose surface an adhesive layer 142 made of uncured photosensitive resin is formed. The wirings 35, 38, the contact holes 37, the connection parts 39, the insulative layer 25, the concave parts 24, and the like are formed on the relay substrate 21. Additionally, the wirings 35 and the like are omitted from the relay substrate 21 in FIG. 15A and FIG. 15B, and the adhesive layer 142 is not illustrated in FIG. 1 and FIG. 2. Further, the relay substrate 21 is not separated for electronic components at this point of time.

The adhesive layer 142 may be basically made of any material having an adhesive function in any method, such as material with an adhesive function due to irradiation of energy ray such as light (particularly, such as ultraviolet ray), radioactive ray (such as X-ray), or electron ray, or material with an adhesive function due to addition of heat, pressure or the like. Here, a material capable of being easily formed and having an adhesive function may be resin-based adhesive layer, particularly photosensitive adhesive, thermosetting adhesive, or thermoplastic adhesive. For example, by use of a photosensitive adhesive, the adhesive layer can have an adhesive function by irradiating light or ultraviolet ray on the adhesive layer or heating the same. Further, by use of a thermosetting adhesive, the adhesive layer can have an adhesive function by heating the adhesive layer by irradiation of light or the like. Furthermore, by use of a thermoplastic adhesive, part of the adhesive layer can be melted to have fluidity by selectively heating it by irradiation of light or the like. Additionally, the adhesive layer may be a pressure-sensitive adhesive (made of acrylic resin or the like, for example), for example.

Figure 13A:
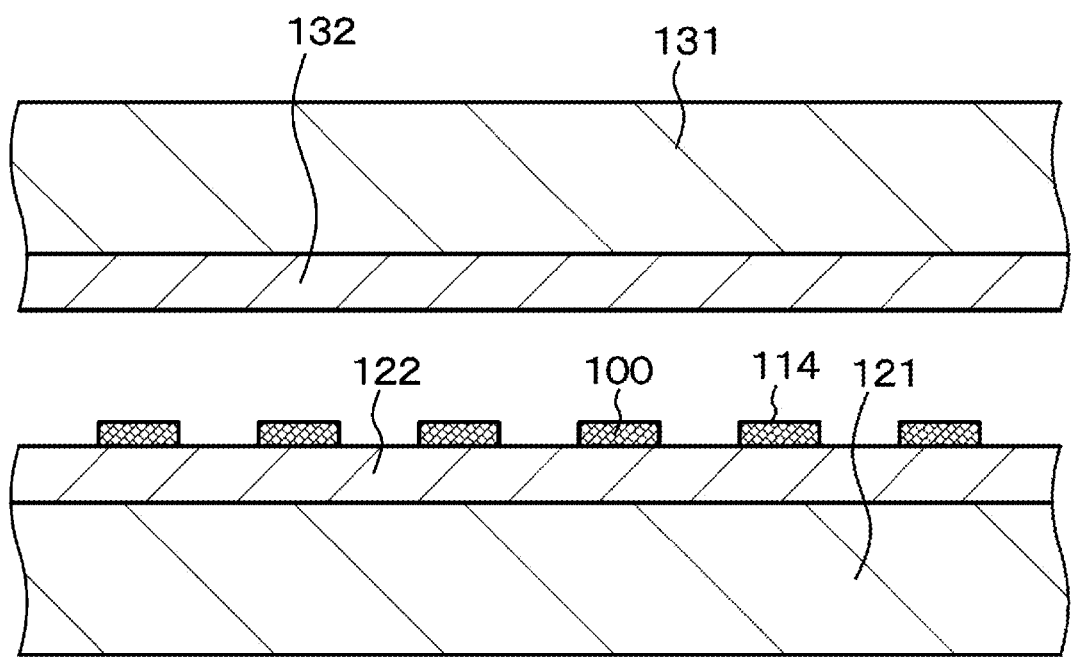
FIG. 13A and FIG. 13B are conceptual diagrams illustrating a cross-section of electronic component and the like for explaining the electronic component mounting method according to the first embodiment subsequent to FIG. 12B.
Figure 13B:
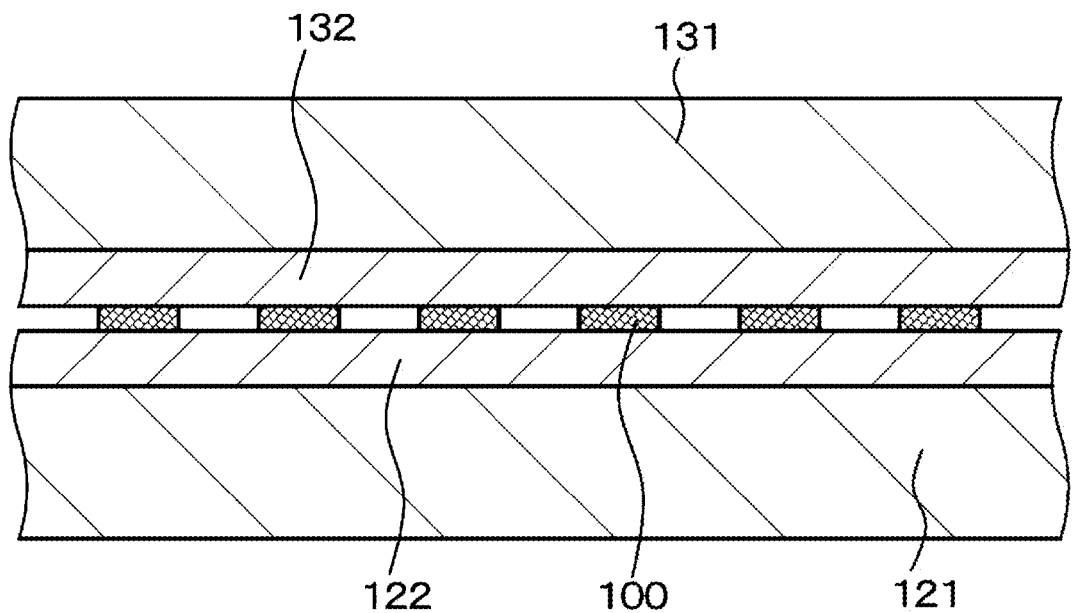

The slightly-viscous layer 132 is then pressed to the light emitting diodes 100 on the first temporary fixing substrate 121 on which the light emitting diodes 100 are left in an array shape (in a 2D matrix) (see FIG. 13A and FIG. 13B). A material making the second temporary fixing substrate 131 may be glass plate, metal plate, alloy plate, ceramic plate, semiconductor substrate, or plastic plate. Further, the second temporary fixing substrate 131 is held by a positioning device (not illustrated). The positioning device operates thereby to adjust a positional relationship between the second temporary fixing substrate 131 and the first temporary fixing substrate 121. An excimer laser is then irradiated on the light emitting diode 100 to be attached from the backside of the first temporary fixing substrate 121 (see FIG. 14A), for example. Thereby, laser abrasion is caused and the excimer laser-irradiated light emitting diodes 100 are released from the first temporary fixing substrate 121. Thereafter, the contact between the second temporary fixing substrate 131 and the light emitting diodes 100 is released, and then the light emitting diodes 100 released from the first temporary fixing substrate 121 enter attached on the slightly-viscous layer 132 (see FIG. 14B).

Figure 15A:
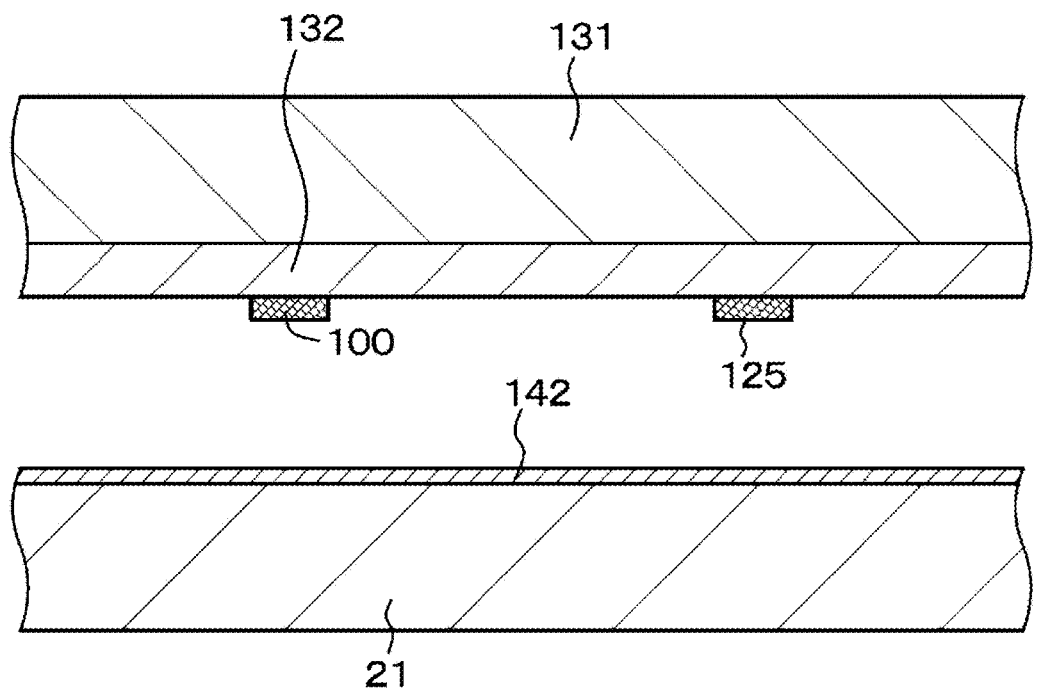
FIG. 15A and FIG. 15B are conceptual diagrams illustrating a cross-section of electronic component and the like for explaining the electronic component mounting method according to the first embodiment subsequent to FIG. 14B.
Figure 15B:
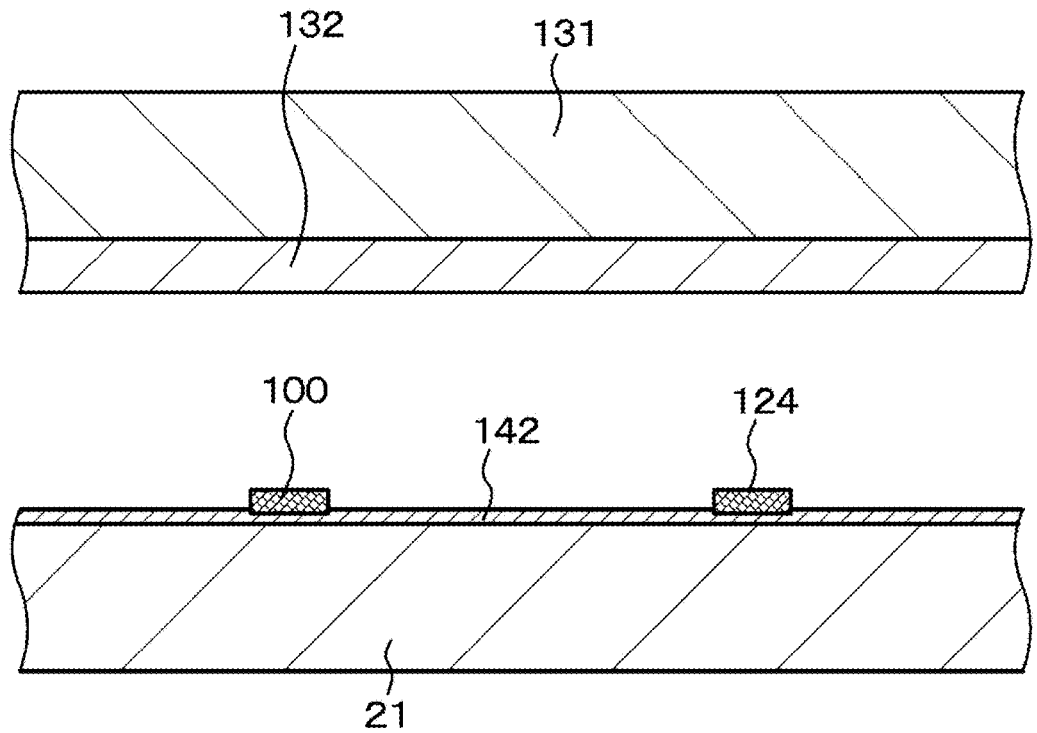
Figure 16A:
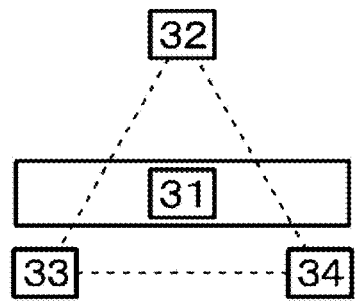
FIGS. 16A to 16E are arrangement diagrams schematically illustrating arrangements of electronic components and a drive circuit.
Figure 16B:
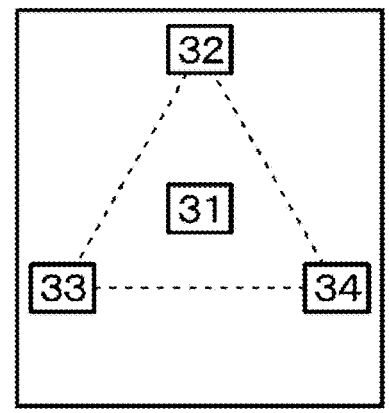
Figure 16C:
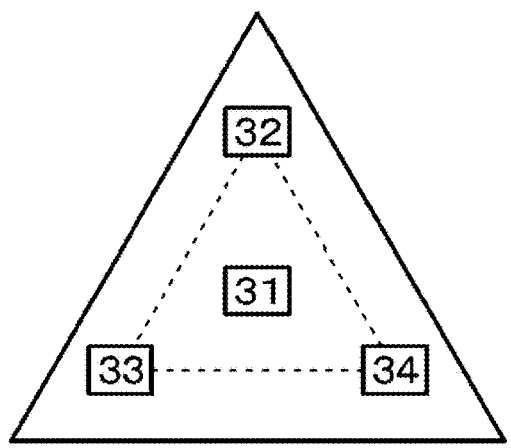
Figure 16D:
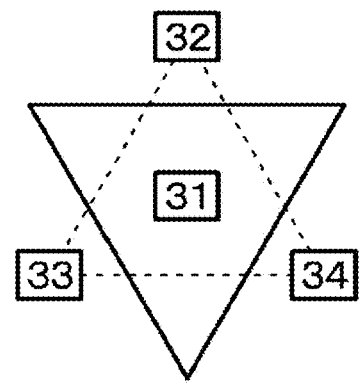
Figure 16E:
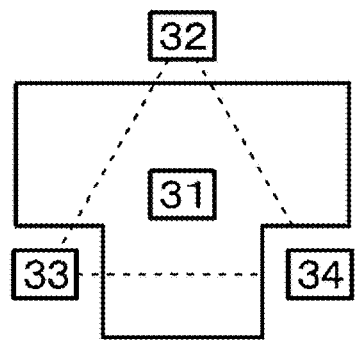
Figure 17:
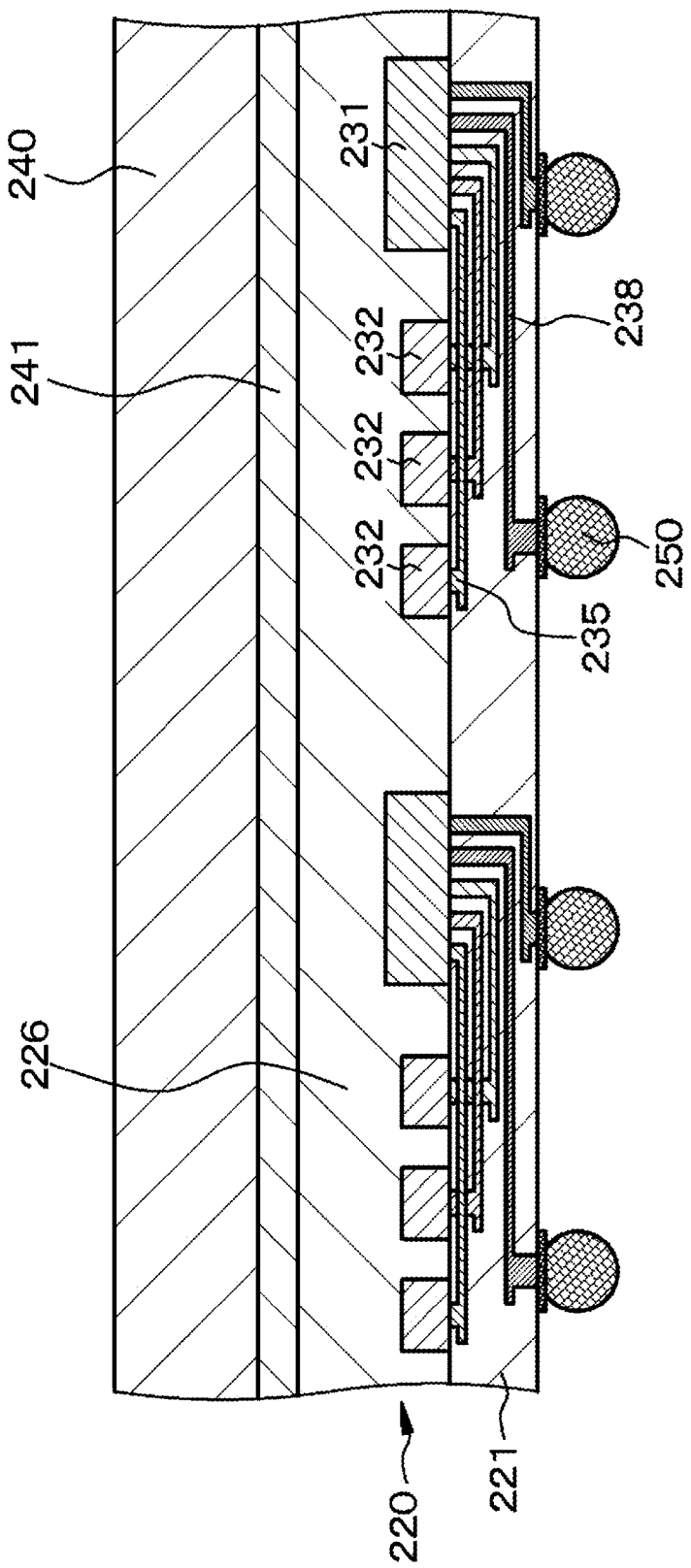
FIG. 17 is a schematic partial cross-section view of conventional mutually-unseparated electronic component.
Figure 18:
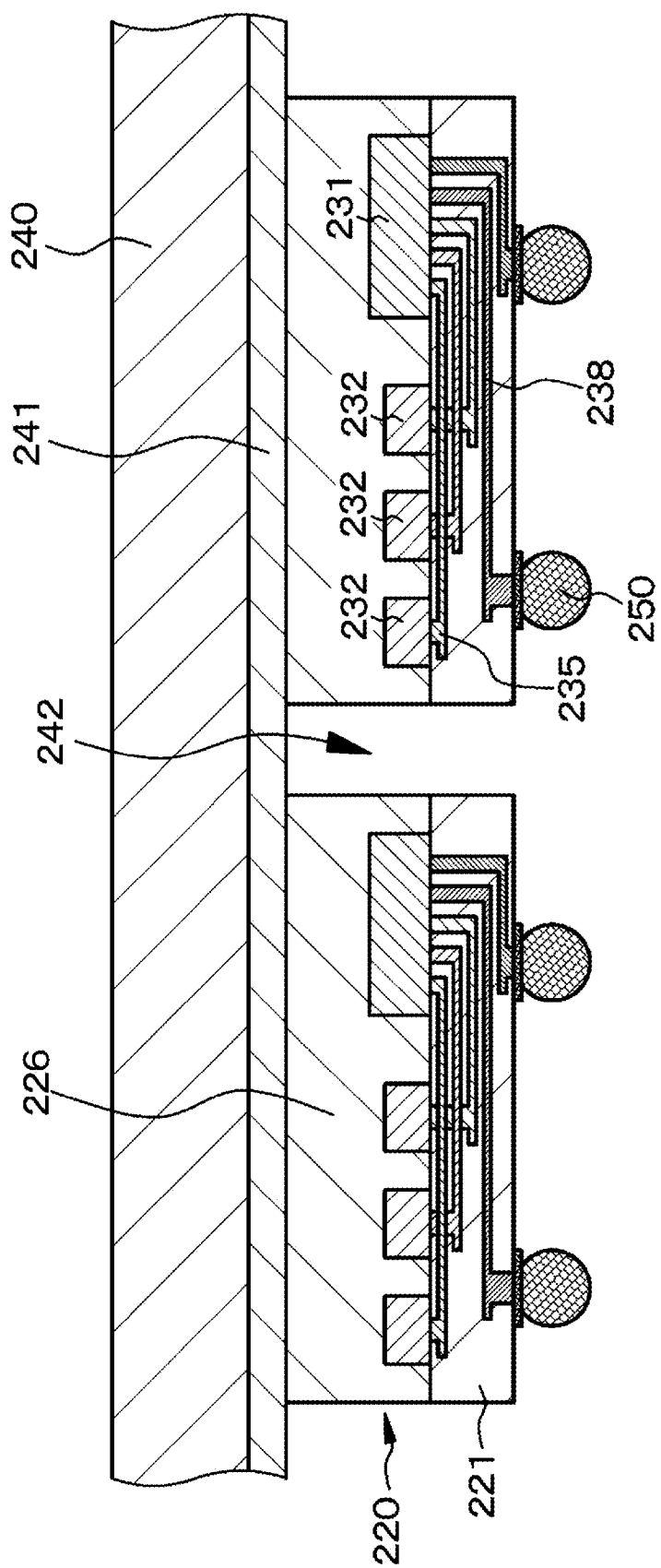
FIG. 18 is a schematic partial cross-section view of conventional mutually-separated electronic component.
Figure 19:
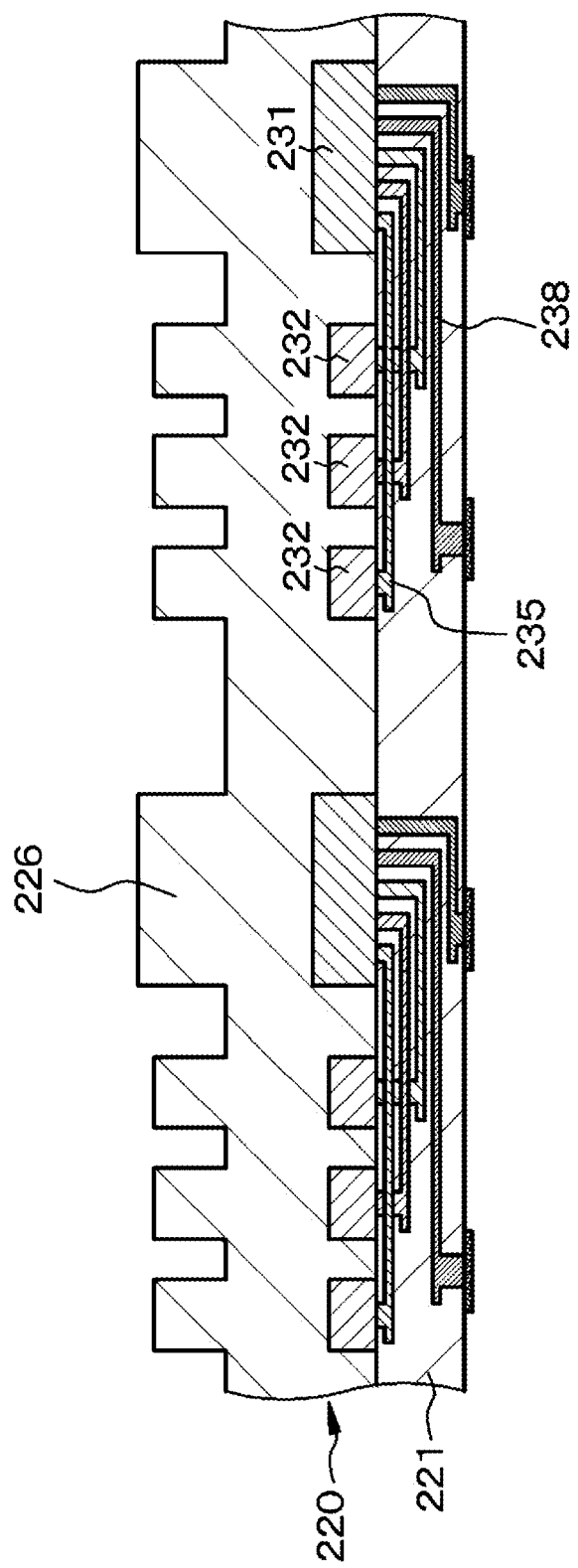
FIG. 19 is a schematic partial cross-section view of conventional mutually-unseparated electronic component for explaining a problem.

The light emitting diodes 100 are then arranged (moved or transferred) on the adhesive layer 142 (see FIG. 15A and FIG. 15B). Specifically, the light emitting diodes 100 are arranged on the adhesive layer 142 on the relay substrate 21 from the second temporary fixing substrate 131 with reference to the alignment marks formed on the relay substrate 21. Since the light emitting diodes 100 are weakly attached on the slightly-viscous layer 132, when the second temporary fixing substrate 131 is moved away from the relay substrate 21 in the state in which the light emitting diodes 100 are contacted (pressed) on the adhesive layer 142, the light emitting diodes 100 are left on the adhesive layer 142. Further, the light emitting diodes 100 are deeply embedded in the adhesive layer 142 by a roller or the like, thereby attaching the light emitting diodes 100 on the relay substrate 21. The first electrodes 114 of the light emitting diodes 100 are connected with the wirings 35.

The system using the second temporary fixing substrate 131 is called step transfer method for convenience. Then, a desired number of light emitting diodes 100 are attached on the slightly-viscous layer 132 in a 2D matrix and transferred on the relay substrate 21 by repeatedly performing the step transfer method desired times. Specifically, according to the first embodiment, 160×120 light emitting diodes 100 are attached on the slightly-viscous layer 132 in a 2D matrix and transferred on the relay substrate 21 in one step transfer. Therefore, 1920×1080 light emitting diodes 100 can be transferred on the relay substrate 21 by repeatedly performing the step transfer method (1920×1080)/(160×120)=108 times. Then, the above step is repeatedly performed three times in total, thereby attaching a predetermined number of red light emitting diodes 32, green light emitting diodes 33 and blue light emitting diodes 34 on the relay substrate 21 at predetermined interval and pitch.

Further, the IC chip 31 is similarly attached on the relay substrate 21.

Thereafter, an ultraviolet ray is irradiated on the adhesive layer 142 made of photosensitive resin, on which the light emitting diodes 100 are arranged, thereby curing the photosensitive resin making the adhesive layer 142. In this way, the light emitting diodes 100 (32, 33, 34) and the IC chip 31 are fixed on the relay substrate 21 by the adhesive layer 142. Then, the light emitting diodes 100 are electrically connected to the IC chip 31.

Additionally, the light emitting diodes 100 may be fixed on the relay substrate 21 and then the wirings 35 may be electrically connected to the light emitting diodes 100 in a plating method by forming dotted adhesive application regions at the regions on the relay substrate 21 where the light emitting diodes 100 are attached, placing the light emitting diodes 100 on the adhesive application regions, and then curing the adhesive at the adhesive application regions instead of forming the adhesive layer 142. The IC chip 31 may be similarly attached on the relay substrate 21 and electrically connected thereto.

[Step-150]

Then, the insulative material film 26 is formed on the entire surface and then subjected to chemical mechanical polishing processing (CMP processing) thereby to planarize the top of the insulative material film 26. Then, the insulative material film 26 and the transfer substrate 40 are applied to each other via the adhesive layer 41. Thereafter, the separation groove 42 for separating the electronic components 20 is formed in a photolithography technique or dry etching technique. Specifically, a resist layer is formed on the insulative layer 25 including the concave parts 24, and the resist layer is removed from the part where the separation groove 42 is to be formed in a photolithography technique. Then, the relay substrate 21 and the insulative material film 26 are etched by use of the resist layer as etching mask. The separation groove 42 can be provided in this way. Additionally, the separation groove 42 for separating the electronic components 20 may be formed in a dicing method.

The electronic component 20 is not provided with a solder bump in this step, and thus the electronic components can be easily separated from each other.

Through the above step, it is possible to prepare the electronic component 20 in which the concave parts 24 are formed on the mounting surface 23 opposite to the mounting substrate 11 and the connection part 39 is exposed at the bottom of the concave part 24. Additionally, the electronic components 20 are in the state illustrated in FIG. 1.

[Step-160]

On the other hand, the mounting substrate 11 which has the electronic component attachment parts 12 each provided with the solder bump 13 and is applied with the flux 14 is prepared in a well-known method.

[Step-170]

Then, the electronic component 20 is placed on the flux 14 such that the concave parts 24 of the electronic component 20 are positioned above the electronic component attachment parts 12 on the mounting substrate 11. Specifically, the electronic component 20 is arranged such that the concave parts 24 of the electronic component 20 are arranged above the electronic component attachment parts 12 on the mounting substrate 11 (more specifically, above the flux 14A) while the electronic component 20 is attached on the transfer substrate 40. A laser is then irradiated on the adhesive layer 41 via the transfer substrate 40 thereby to release the adhesion between the transfer substrate 40 and the electronic component 20 and to place the electronic component 20 on the flux 14. Then, the solder bumps 13 are melted and the electronic component attachment parts 12 provided on the mounting substrate 11 are soldered to the connection parts 39 provided in the electronic component 20 in a well-known method. The electronic component mounting substrate 10A illustrated in FIG. 2 can be obtained in this way. The electronic component mounting substrate 10A is then assembled thereby to manufacture a display device.

In the electronic component used in the electronic component mounting substrate according to the first embodiment or the electronic component mounting method according to the first embodiment, the concave parts are formed on the mounting surface of the electronic component opposite to the mounting substrate, and the connection part is exposed at the bottom of the concave part. Therefore, when the electronic component attachment parts provided on the mounting substrate are soldered to the connection parts provided in the electronic component, positional alignment between the electronic component attachment parts and the connection parts can be accurately performed with high accuracy. Further, an impact on the electronic component can be absorbed by the concave parts when the electronic component is mounted, thereby accurately preventing the electronic component from being damaged. Additionally, the solder bumps are provided on the electronic component attachment parts, thereby easily separating the electronic components from each other when the electronic components are manufactured.

Second Embodiment

Figure 3:
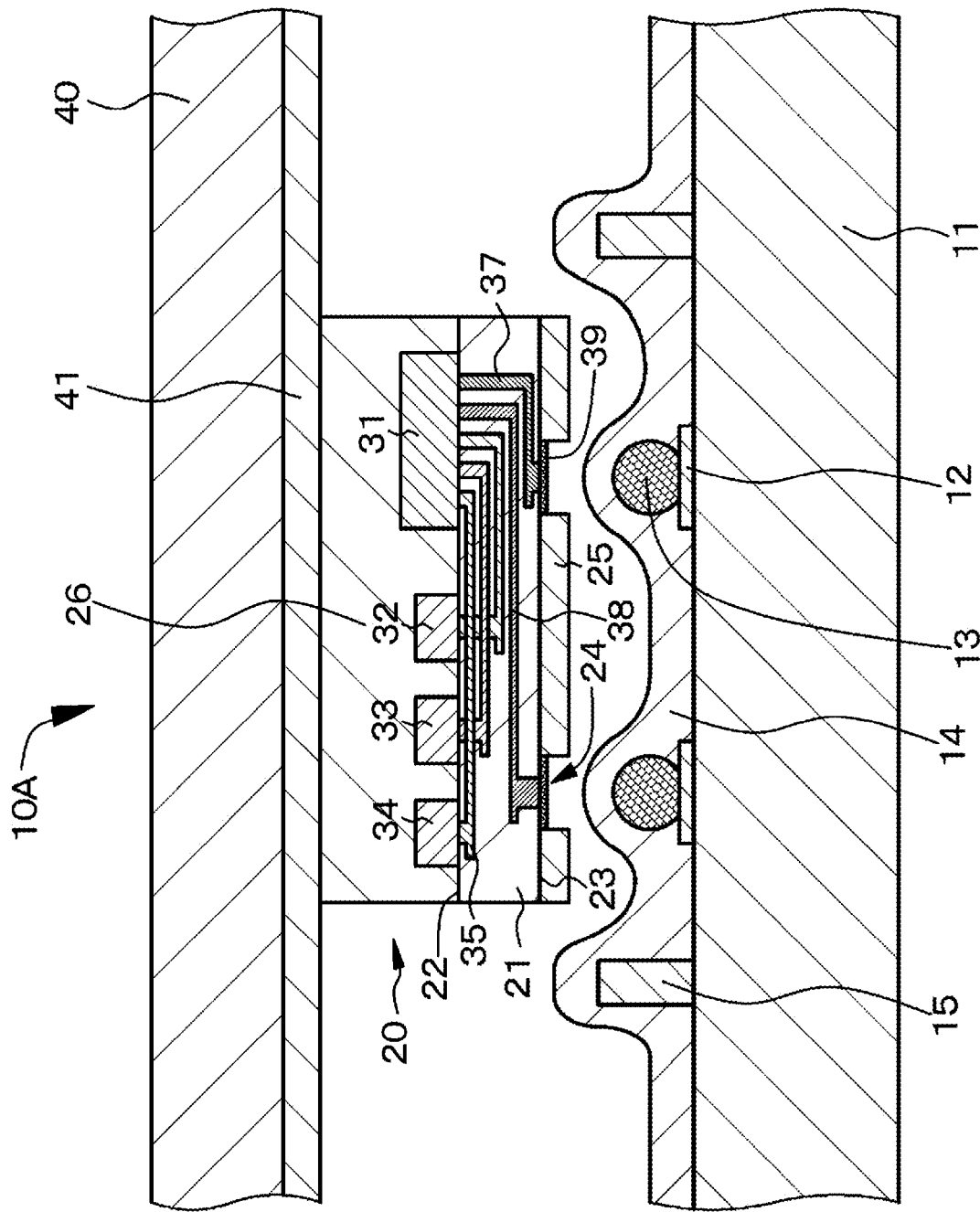
FIG. 3 is a schematic partial end view for explaining an electronic component mounting substrate according to a second embodiment.

A second embodiment is a variant of the first embodiment. FIG. 3 illustrates a schematic partial end view for explaining the electronic component mounting substrate according to the second embodiment, and protruded parts 15 made of solder resist, silicone resin, polyimide resin, epoxy resin, acrylic resin, or the like are provided on the mounting substrate 11 to surround the electronic component attachment parts 12 provided on the mounting substrate 11 in the second embodiment. The protruded parts 15 surround the electronic component attachment parts 12, and specifically, the protruded parts 15 may continuously surround the electronic component attachment parts 12 or may discontinuously surround the electronic component attachment parts 12. The protruded parts 15 are formed so that the flux 14 in the region on the mounting substrate 11 surrounded by the protruded parts 15 (the region on which the electronic component 20 is attached) is concaved when the flux 14 is applied on the mounting substrate 11. Consequently, when the electronic component 20 is placed on the flux 14, the electronic component 20 can be accurately positioned above the electronic component attachment parts 12 due to the self-alignment effect based on surface tension of the flux 14.

Third Embodiment

Figure 4:
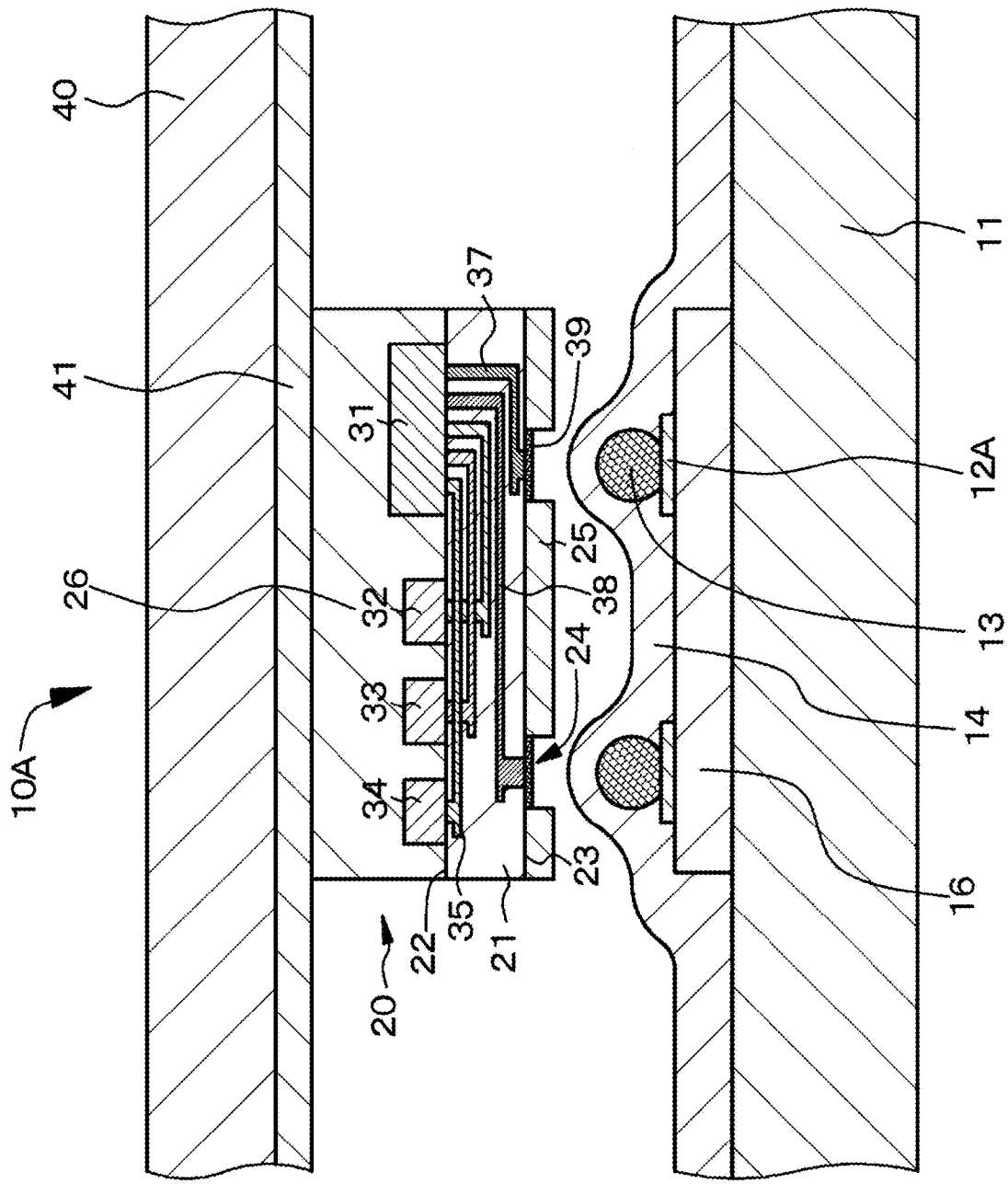
FIG. 4 is a schematic partial end view for explaining an electronic component mounting substrate according to a third embodiment.

A third embodiment is also a variant of the first embodiment. FIG. 4 illustrates a schematic partial end view for explaining the electronic component mounting substrate according to the third embodiment, and a convex part 16 made of solder resist, silicone resin, polyimide resin, epoxy resin, acrylic resin, or the like is provided at the part on the mounting substrate 11 where the electronic component 20 is provided, and electronic component attachment parts 12A are provided on the convex part 16 in the third embodiment. The electronic component attachment part 12A is configured of an extending part of the wiring (not illustrated) provided on the mounting substrate 11, and can be formed in a plating method, for example. The convex part 16 is formed so that the flux 14 on the convex part 16 protrudes from the flux 14 on other region on the mounting substrate 11 when the flux 14 is applied on the mounting substrate 11. Consequently, when the electronic component 20 is placed on the flux 14, the electronic component 20 can be accurately positioned above the electronic component attachment parts 12 due to the self-alignment effect based on surface tension of the flux 14.

Fourth Embodiment

Figure 5:
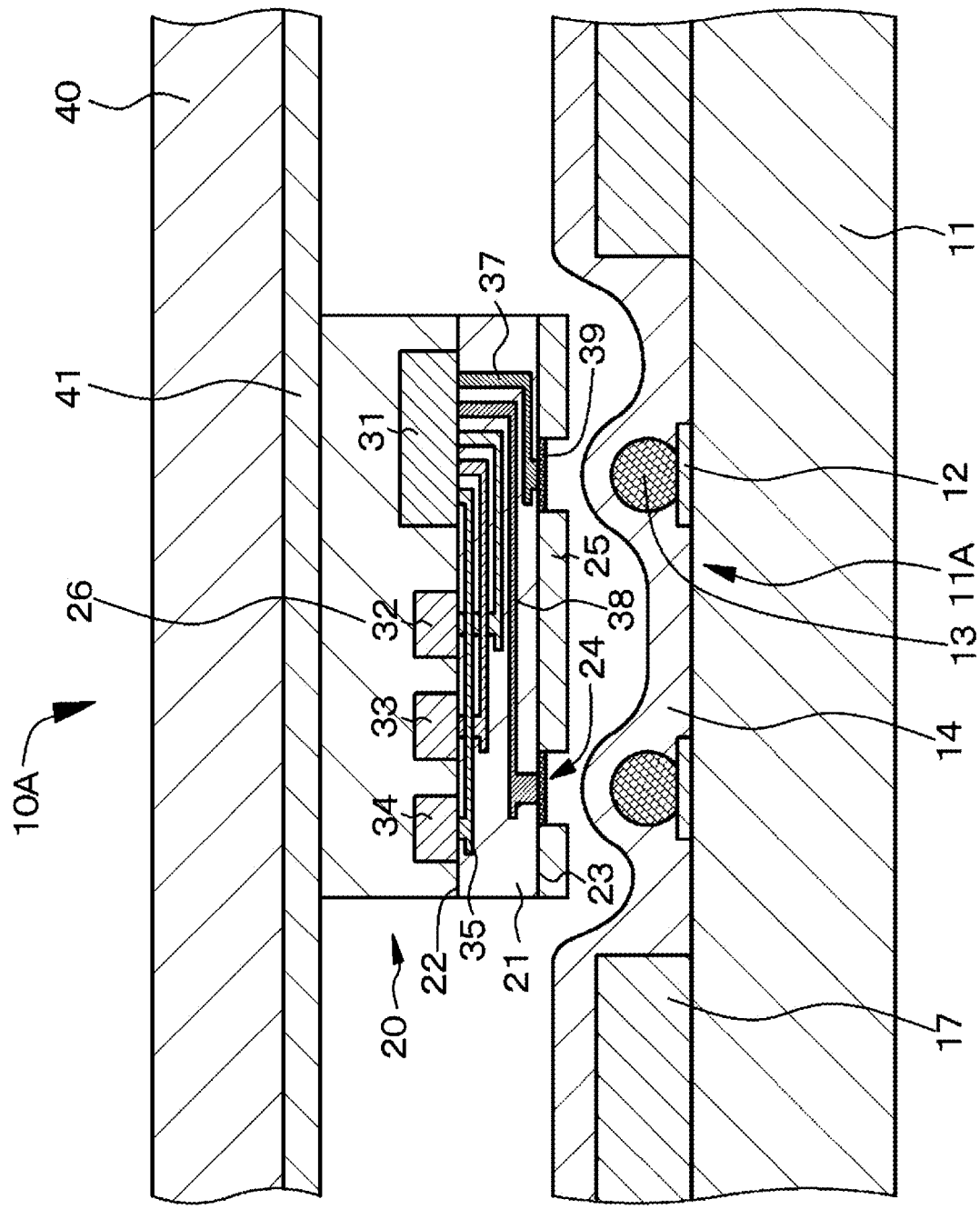
FIG. 5 is a schematic partial end view for explaining an electronic component mounting substrate according to a fourth embodiment.

A fourth embodiment is also a variant of the first embodiment. FIG. 5 illustrates a schematic partial end view for explaining the electronic component mounting substrate according to the fourth embodiment, and convex parts 17 made of solder resist, silicone resin, polyimide resin, epoxy resin, acrylic resin, or the like are provided on the mounting substrate 11 to surround a part 11A on the mounting substrate 11 on which the electronic component 20 is mounted in the fourth embodiment. The convex parts 17 are formed so that the flux 14 in the region (the region where the electronic component 20 is attached) 11A on the mounting substrate 11 surrounded by the convex parts 17 is concaved when the flux 14 is applied on the mounting substrate 11. Consequently, when the electronic component 20 is placed on the flux 14, the electronic component 20 can be accurately positioned above the electronic component attachment parts 12 due to the self-alignment effect based on surface tension of the flux 14.

Fifth Embodiment

Figure 6:
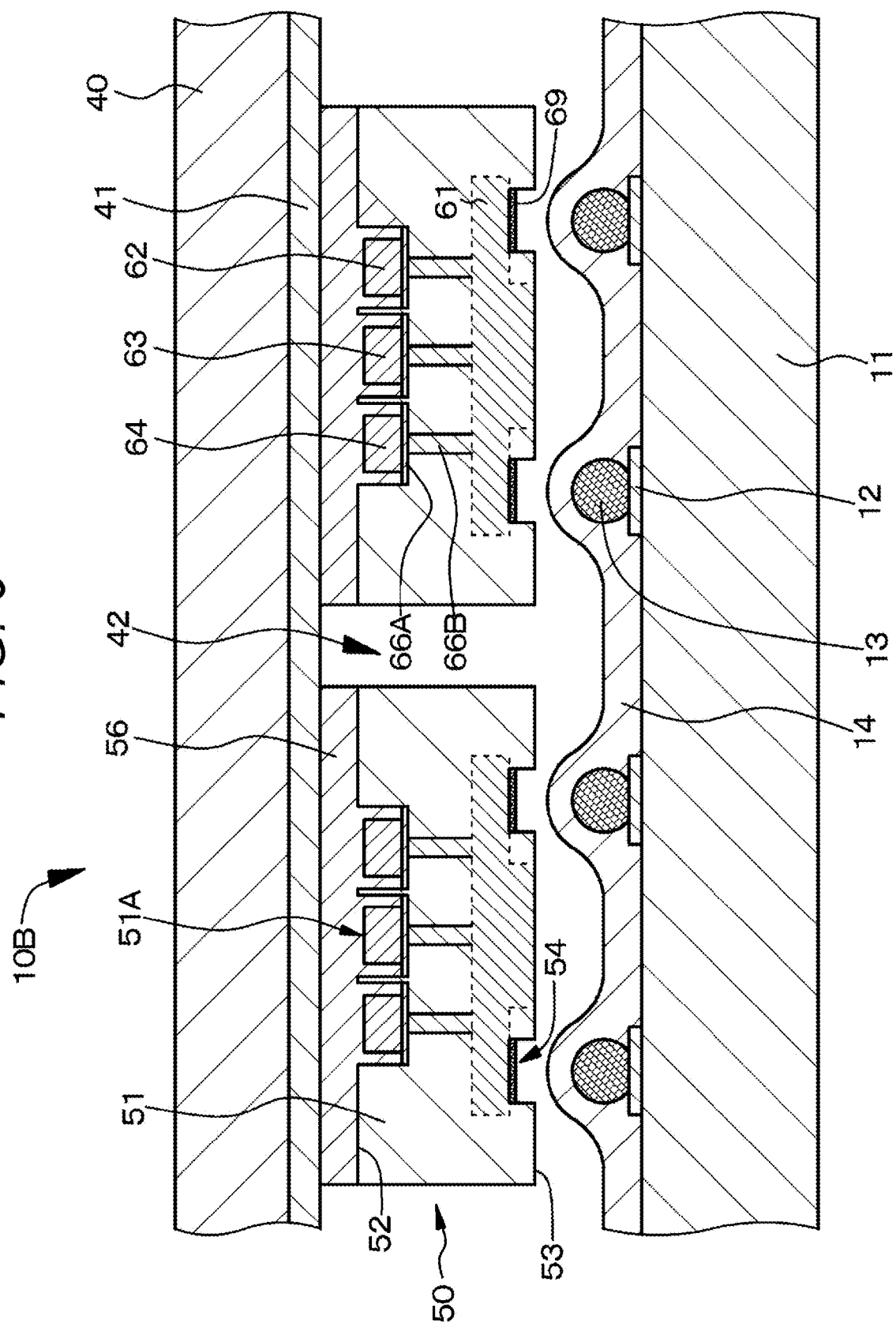
FIG. 6 is a schematic partial end view for explaining an electronic component mounting substrate according to a fifth embodiment.
Figure 7:
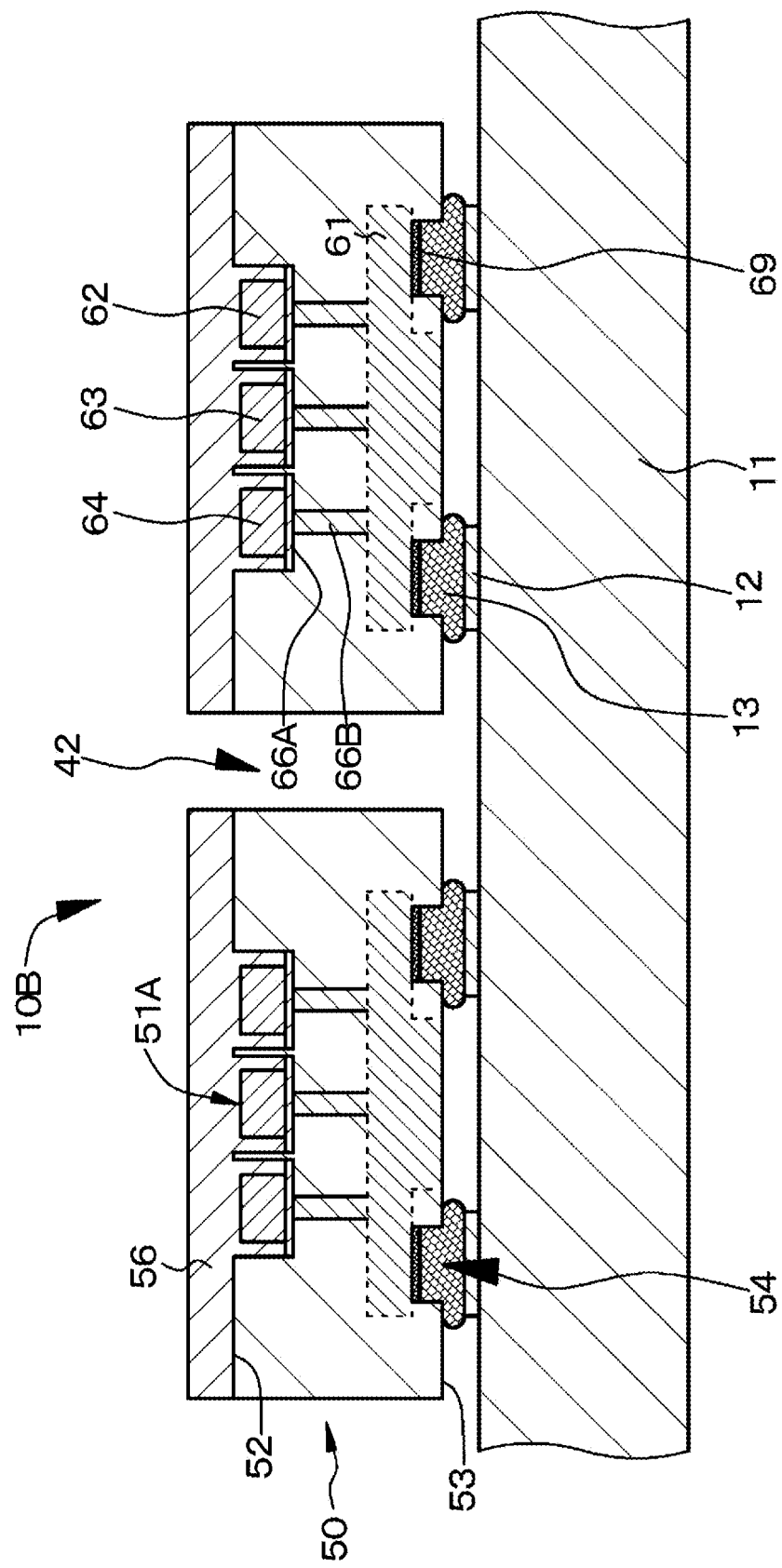
FIG. 7 is a schematic partial end view of the electronic component mounting substrate according to the fifth embodiment.

A fifth embodiment relates to the electronic component according to the present disclosure, is a variant of the first embodiment, and relates to the electronic component in the first form. FIG. 6 illustrates a schematic partial end view for explaining the electronic component mounting substrate according to the fifth embodiment, and FIG. 7 illustrates a schematic partial end view of an electronic component mounting substrate 10B according to the fifth embodiment.

An electronic component 50 according to the fifth embodiment includes a semiconductor substrate 51 formed of a silicon semiconductor substrate, electronic devices 62, 63, 64, and a drive circuit 61 formed on the semiconductor substrate 51 and directed for driving the electronic devices 62, 63, 64. In addition, the electronic devices 62, 63, 64 are attached in an attachment concave part 51A formed in the semiconductor substrate 51 (on a first surface 52 of the semiconductor substrate 51) positioned above the drive circuit 61, and the drive circuit 61 is electrically connected to the electronic devices 62, 63, 64 via connection holes 66B formed in the semiconductor substrate 51. Additionally, the semiconductor substrate 51 has a second surface 53 opposite to the first surface 52 (second surface 53 opposite to the first surface 52 and corresponding to the mounting surface). The drive circuit 61 is formed on the second surface 53 of the semiconductor substrate 51. The drive circuit 61 is electrically connected to the electronic devices 62, 63, 64 via contact parts 66A formed at the bottom of the attachment concave part 51A and the connection holes 66B formed in the semiconductor substrate 51, specifically. The first surface 52 of the semiconductor substrate 51 including the electronic devices 62, 63, 64 is covered with an insulative material film 56. Additionally, the region of the drive circuit 61 is surrounded in a dotted line.

Further, in the electronic component 50 according to the fifth embodiment, concave parts 54 are formed on the second surface 53 of the semiconductor substrate 51, and a connection part 69 extending from the drive circuit 61 is exposed at the bottom of the concave part 54. The concave parts 54 can be formed by etching the semiconductor substrate 51 in the thickness direction. The electronic component attachment parts 12 are then soldered to the connection parts 69 provided in the electronic component 50 via the solder bumps 13 provided on the electronic component attachment parts 12 provided on the mounting substrate 11. Various circuits and wirings are formed on the mounting surface (the second surface 53 of the semiconductor substrate 51) of the electronic component 50 opposite to the mounting substrate 11, but are not illustrated.

Figure 8:
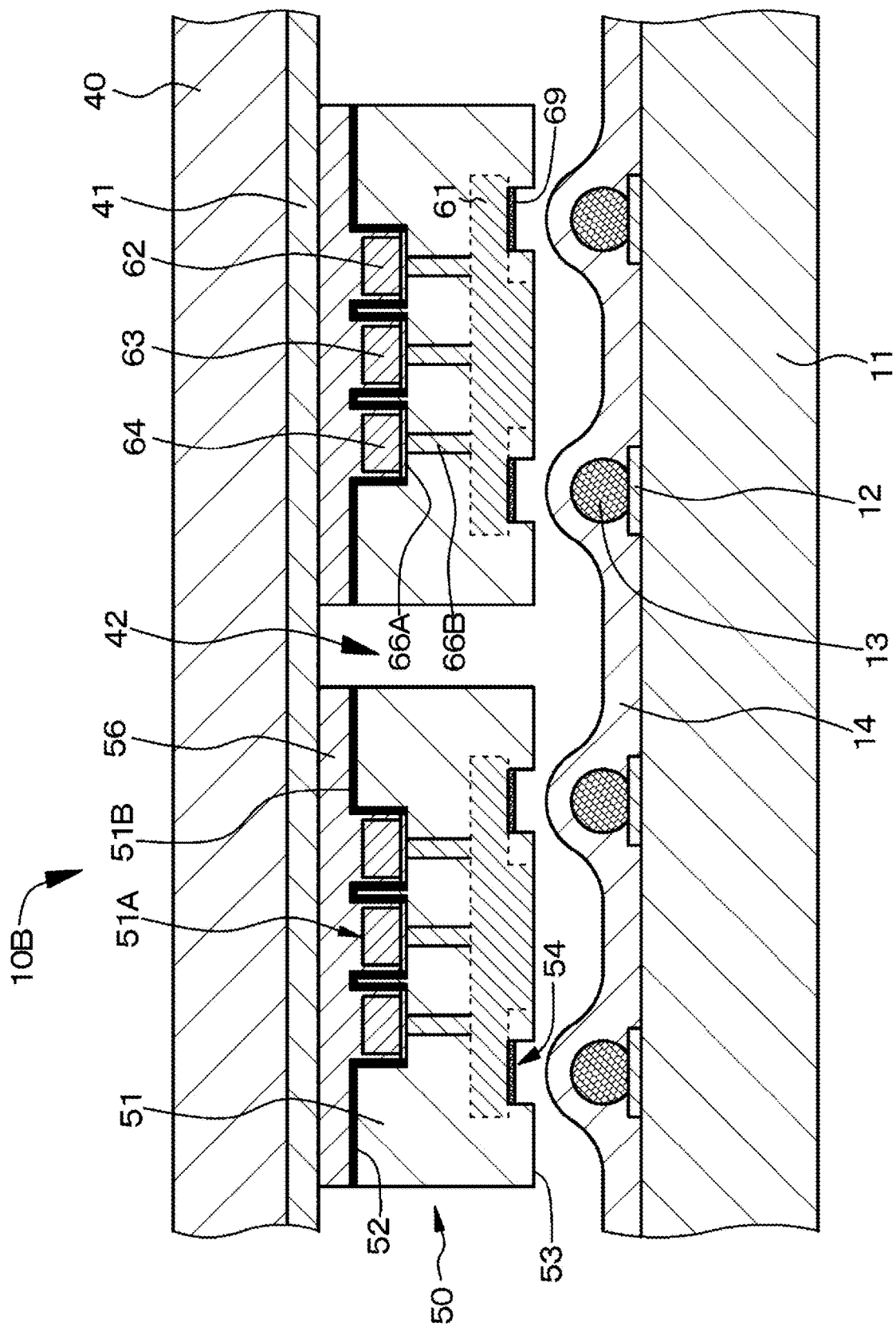
FIG. 8 is a schematic partial end view for explaining an electronic component mounting substrate according to a sixth embodiment.

In the electronic component 50 according to the fifth embodiment, the electronic devices are configured of the red light emitting diode 62 for emitting a red light, the green light emitting diode 63 for emitting green light, and the blue light emitting diode 64 for emitting blue light, the drive circuit 61 is electrically connected to the red light emitting diode 62 via the connection hole (first connection hole) 66B formed in the semiconductor substrate 51, the drive circuit 61 is electrically connected to the green light emitting diode 63 via the connection hole (second connection hole) 66B formed in the semiconductor substrate 51, and the drive circuit 61 is electrically connected to the blue light emitting diode 64 via the connection hole (third connection hole) 66B formed in the semiconductor substrate 51. Further, the red light emitting diode 62, the green light emitting diode 63, and the blue light emitting diode 64 are arranged at the vertices of a regular triangle, and the center of the regular triangle matches with the center of gravity of the drive circuit 61. Additionally, the arrangements of the light emitting diodes illustrated in FIG. 6 to FIG. 8 are different from this arrangement for simplifying the drawings. There is illustrated a state in which one part (one electrode) of a light emitting diode is connected to the wiring or the like, but actually two parts (two electrodes) of a light emitting diode are connected to the wirings or the like.

The attachment concave part 51A formed on the first surface 52 of the semiconductor substrate 51 can be formed by etching the semiconductor substrate 51 from the first surface in the thickness direction, for example. The electronic devices 62, 63, 64 can be attached in the attachment concave part 51A provided on the first surface 52 by use of solder bumps, for example. The connection holes 66B in the semiconductor substrate 51 can be formed in a well-known through-silicon via (TSV) forming technique or through-chip via (TCV) forming technique, for example.

The transfer method and the electronic component mounting method according to the present disclosure will be described below.

[Step-500]

Figure 14A:
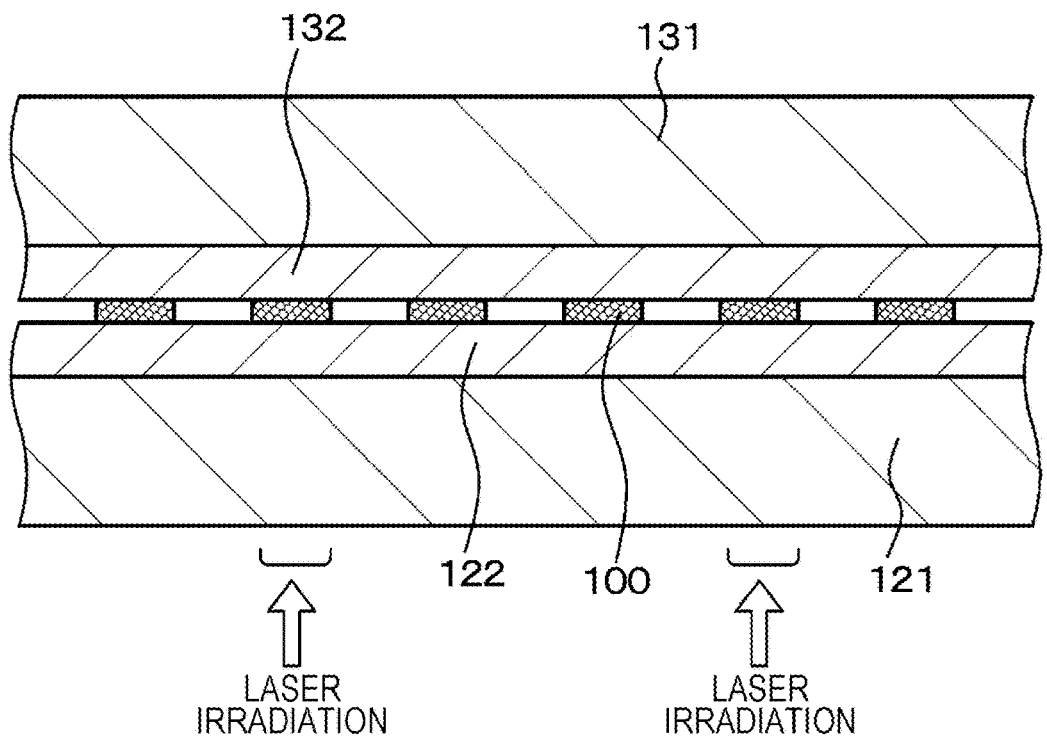
FIG. 14A and FIG. 14B are conceptual diagrams illustrating a cross-section of electronic component and the like for explaining the electronic component mounting method according to the first embodiment subsequent to FIG. 13B.
Figure 14B:
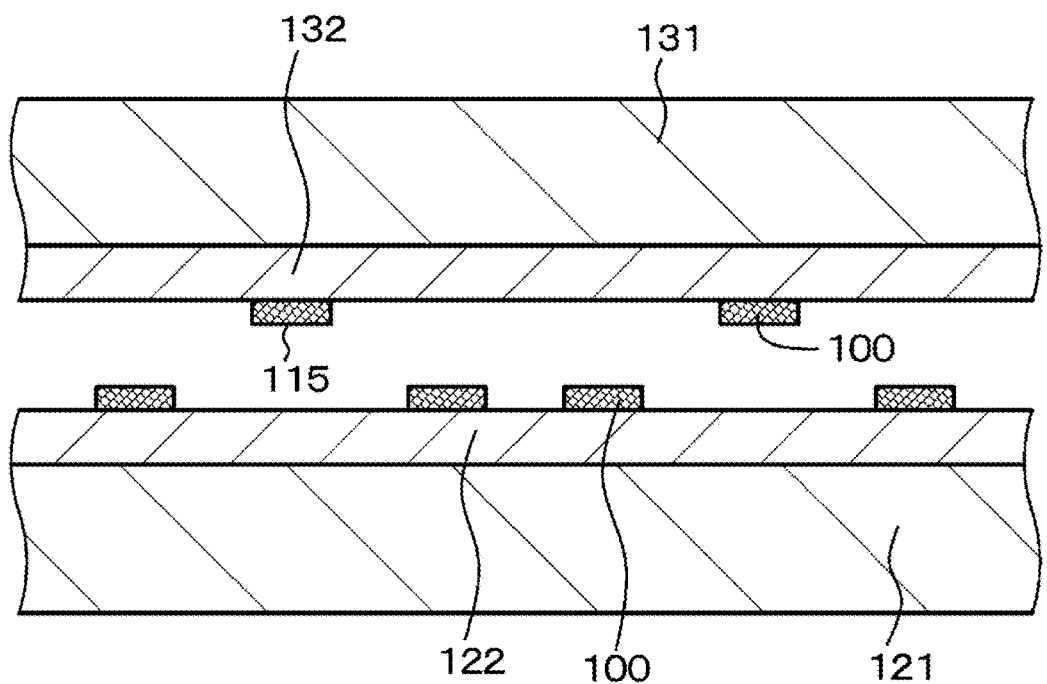

The steps similar to [Step-100] to [Step-130] according to the first embodiment are first performed, and then the steps up to [Step-140] illustrated in FIG. 14B are performed.

The light emitting diodes 100 are then embedded in the attachment concave part 51A formed in the first surface 52 of the semiconductor substrate 51. Specifically, the light emitting diodes 100 are embedded in the attachment concave part 51A in the semiconductor substrate 51 from the second temporary fixing substrate 131 with reference to the alignment marks formed on the semiconductor substrate 51. The light emitting diodes 100 are just weakly attached on the slightly-viscous layer 132, and thus when the second temporary fixing substrate 131 is moved away from the semiconductor substrate 51 while the light emitting didoes 100 are arranged in the attachment concave part 51A, the light emitting diodes 100 are left in the attachment concave part 51A. The first electrodes 114 of the light emitting diodes 100 are connected with the contact parts 66A. The light emitting diodes 100 are then electrically connected to the drive circuit 61.

The above step is then repeatedly performed three times in total so that a predetermined number of red light emitting diodes 62, green light emitting diodes 63, and blue light emitting diodes 64 can be arranged in the attachment concave part 51A in the semiconductor substrate 51 at predetermined interval and pitch.

Additionally, the light emitting diodes 100 may be fixed in the attachment concave part 51A and then the contact parts 66A may be electrically connected to the light emitting diodes 100 in a plating method by forming dotted adhesive application regions in the attachment concave part 51A, placing the light emitting diodes 100 at the adhesive application regions, and then curing the adhesive at the adhesive application regions.

[Step-510]

Then, the insulative material film 56 is formed on the entire surface and then subjected to chemical mechanical polishing processing (CMP processing) thereby to planarize the top of the insulative material film 56. The insulative material film 56 is then applied to the transfer substrate 40 via the adhesive layer 41. Thereafter, the separation groove 42 for separating the electronic components 50 is formed in a photolithography technique and a dry etching technique. Specifically, a resist layer is formed on the second surface 53 of the semiconductor substrate 51 including the concave parts 54, and the resist layer is removed from the part where the separation groove 42 is to be formed in the photolithography technique. The semiconductor substrate 51 and the insulative material film 56 are then etched by using the resist layer as etching mask. Additionally, the separation groove 42 can be provided in this way. The separation groove 42 for separating the electronic components 50 can be formed in a dicing method.

In this step, the light emitting diodes 100 are arranged in the attachment concave part 51A, and thus the insulative material film corresponding to the surface to which the electronic component is applied is easily planarized when the electronic component is applied to the transfer substrate. Additionally, the electronic component 50 is not provided with a solder bump, and thus the electronic components can be easily separated from each other.

Through the above step, the concave parts 54 are formed on the mounting surface 53 opposite to the mounting substrate 11, and the electronic component 50 in which the connection part 69 is exposed at the bottom of the concave part 54 can be prepared. Additionally, the electronic components 50 are in the state illustrated in FIG. 6.

[Step-520]

On the other hand, the mounting substrate 11 having the electronic component attachment parts 12 provided with the solder bumps 13 thereon and applied with the flux 14 is prepared in a well-known method.

[Step-530]

Then, the electronic component 50 is placed on the flux 14 such that the concave parts 54 of the electronic component 50 are positioned above the electronic component attachment parts 12 on the mounting substrate 11. Specifically, the electronic component 50 is arranged such that the concave parts 54 of the electronic component 50 are positioned above the electronic component attachment parts 12 on the mounting substrate 11 (more specifically, above the flux 14A) while the electronic component 50 is attached on the transfer substrate 40. The adhesion between the transfer substrate 40 and the electronic component 50 is then released by irradiating a laser on the adhesive layer 41 via the transfer substrate 40, and the electronic component 50 is placed on the flux 14. The solder bumps 13 are melted thereby to solder the electronic component attachment parts 12 provided on the mounting substrate 11 to the connection parts 69 provided in the electronic component 50 in a well-known method. The electronic component mounting substrate 10B illustrated in FIG. 7 can be obtained in this way. The electronic component mounting substrate 10B is then assembled thereby to manufacture a display device.

The electronic devices are attached in the attachment concave part formed in the semiconductor substrate positioned above the drive circuit in the electronic component according to the fifth embodiment as described above, and thus the surface to which the electronic component is applied can be easily planarized when the electronic component is applied to the transfer substrate after the electronic component is manufactured. Additionally, the electronic devices and the drive circuit are integrally provided on the semiconductor substrate, thereby achieving downsized module, thinned layers, and enhancement in yield of semiconductor substrate (wafer).

Additionally, needless to say, the protruded parts 15, the convex part 16, and the convex parts 17 described according to the second embodiment, the third embodiment, and the fourth embodiment can be applied to the fifth embodiment.

Sixth Embodiment

A sixth embodiment is a variant of the fifth embodiment. FIG. 8 illustrates a schematic partial end view for explaining the electronic component mounting substrate according to the sixth embodiment, and a light shielding film 51B made of aluminum thin film is formed in the attachment concave part 51A in a sputtering method, for example, in the electronic component 50 according to the sixth embodiment. Alternatively, a light shielding film may be formed on the outer surfaces (such as side surfaces) of the electronic devices 62, 63, 64.

The electronic component according to the sixth embodiment has the similar configuration and structure to the electronic component according to the fifth embodiment except the above point, and thus the detailed description thereof will be omitted. Additionally, a light shielding film may be formed on the outer surfaces of the electronic devices 32, 33, 34 described according to the first embodiment, or a light shielding film may be formed on the outer surface of the IC chip 31.

Seventh Embodiment

According to the first embodiment to the sixth embodiment described above, the red light emitting diodes 32, 62, the green light emitting diodes 33, 63, and the blue light emitting diodes 34, 64 are arranged at the vertices of a regular triangle, respectively, and the center of the regular triangle matches with the center of gravity of the drive circuit or the like 31, 61. The arrangement in this state is schematically illustrated in FIG. 16A, FIG. 16B, FIG. 16C, FIG. 16D, and FIG. 16E. Additionally, the electronic devices 32, 33, 34 are indicated in rectangle, the regular triangle is indicated in a dotted line, and the center of gravity of the IC chip 31 is indicated in rectangle describing "31" therein in the drawings. Here, in the examples illustrated in FIG. 16A and FIG. 16B, the planar shape of the IC chip 31 is rectangular. Further, in the examples illustrated in FIG. 16C and FIG. 16D, the planar shape of the IC chip 31 is regular-triangular. Further, in the example illustrated in FIG. 16E, the planar shape of the IC chip 31 is a rectangle with one protruded side. However, the planer shape of the drive circuit or the like 31, 61 is not limited thereto.

The present disclosure has been described above according to the preferred embodiments, but the present disclosure is not limited to the embodiments. The configurations and structures of the electronic component, the electronic devices, the light emitting diodes, the mounting substrate, and the electronic component mounting substrate according to the present disclosure, and the materials making them, and the like are exemplary, and can be changed as needed, and the electronic component mounting method according to the present disclosure is also exemplary, and can be changed as needed. An electronic component including three electronic devices has been described according to the embodiments, but four electronic devices may be provided, for example, and in this case, the electronic devices may be arranged at the vertices of a square or rectangle. A gap between the electronic component and the mounting substrate (see reference numeral 27 in FIG. 2) may be filled with an underfill member after the electronic component is mounted. The electronic component may be connected to the mounting substrate not in a soldering method but in a plating method as needed.

Figure 9A:
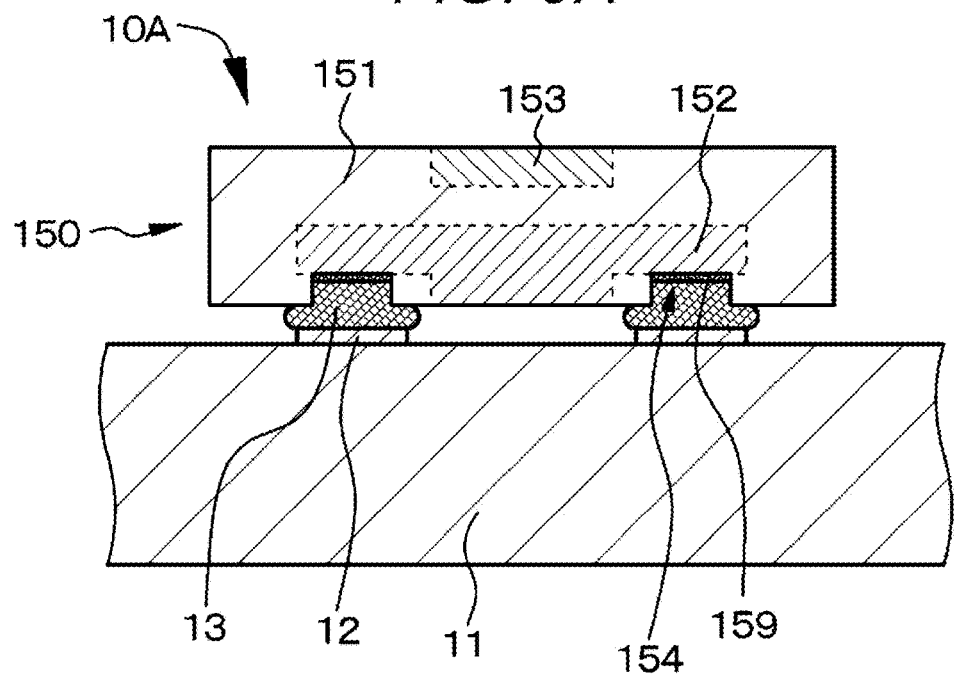
FIG. 9A and FIG. 9B are schematic partial end views of a variant of the electronic component mounting substrate according to the first embodiment.
Figure 9B:
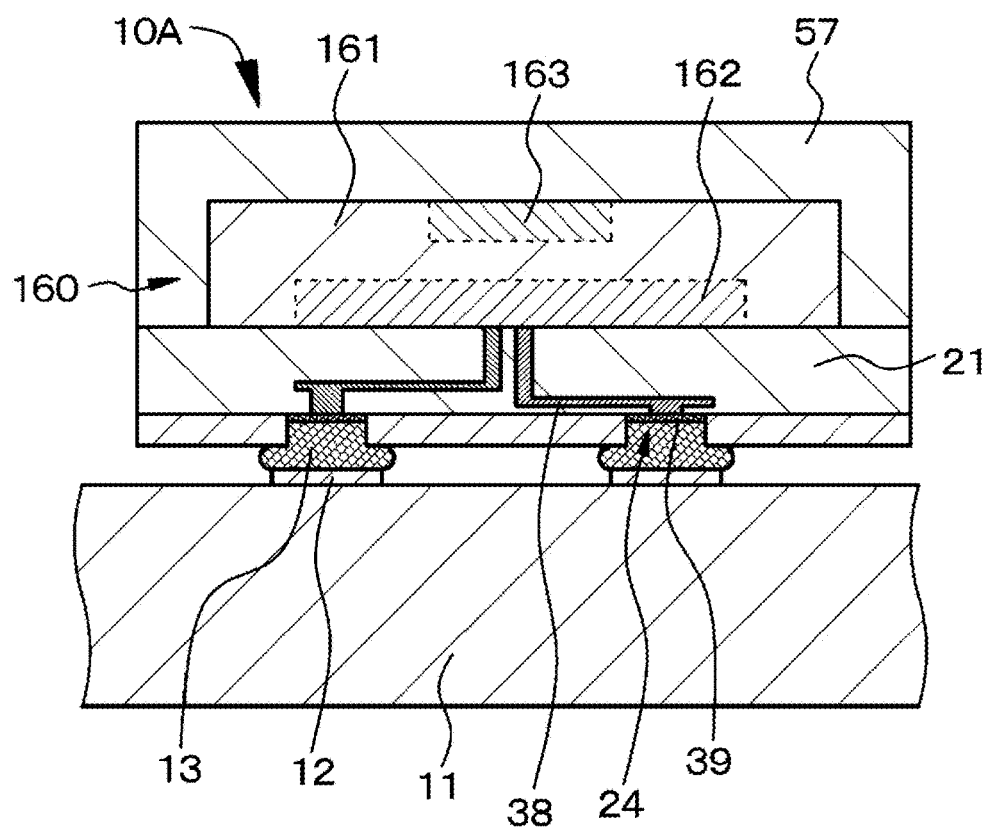

The description has been made assuming that the electronic component is provided with the relay substrate 21 and the electronic devices are attached on the relay substrate 21 according to the first embodiment to the fourth embodiment, but the electronic components according to the first embodiment to the fourth embodiment are not limited to the form. As illustrated in FIG. 9A, an electronic component 150 may be configured such that electronic devices 153 such as light emitting diodes (LED), temperature sensor, moisture sensor, and pressure sensor, and a drive circuit 152 are formed on a semiconductor substrate 151. Concave parts 154 are formed in the semiconductor substrate 151. A connection part 159 is exposed at the bottom of the concave part 154. Alternatively, as illustrated in FIG. 9B, an electronic component 160 can be configured such that electronic devices 163 such as light emitting diodes (LED), temperature sensor, moisture sensor, and pressure sensor, and a drive circuit 162 are formed on a semiconductor substrate 161 and the semiconductor substrate 161 is attached to the relay substrate 21. The concave parts 24 are formed in the relay substrate 21. The connection part 39 is exposed at the bottom of the concave part 24. The electronic devices 153, 163 and the drive circuit 152, 162 are connected to each other via contact holes (not illustrated). The electronic devices attached on the relay substrate 21 are covered with a transparent resin film 57. This is similarly applicable to the following example illustrated in FIG. 10.

Figure 10:
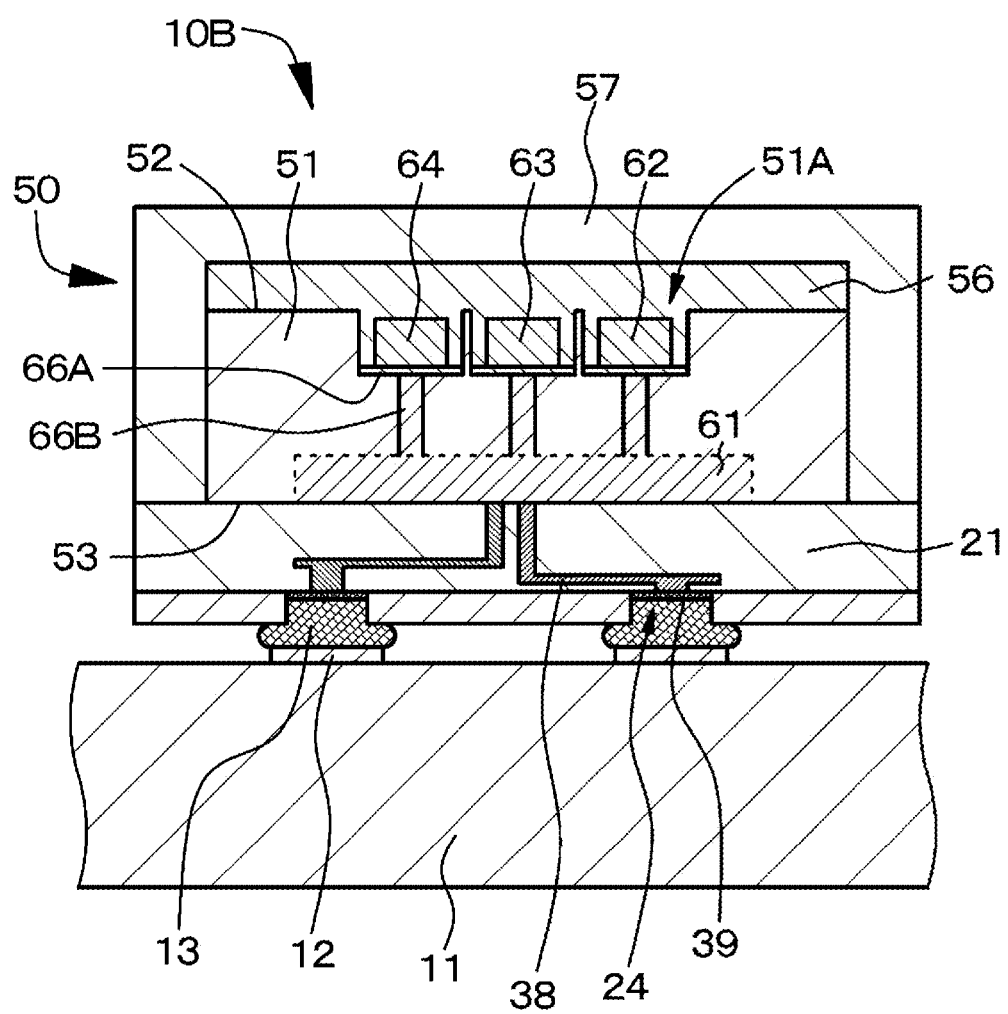
FIG. 10 is a schematic partial end view of a variant of the electronic component mounting substrate according to the fifth embodiment.
Figure 11A:
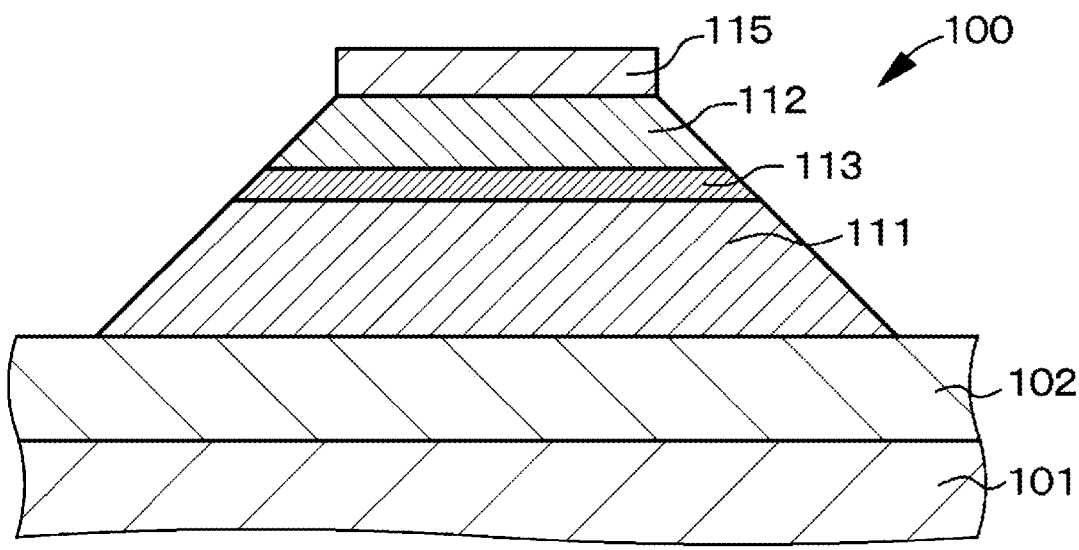
FIG. 11A and FIG. 11B are conceptual diagrams illustrating a cross-section of electronic component and the like for explaining an electronic component mounting method according to the first embodiment.
Figure 11B:
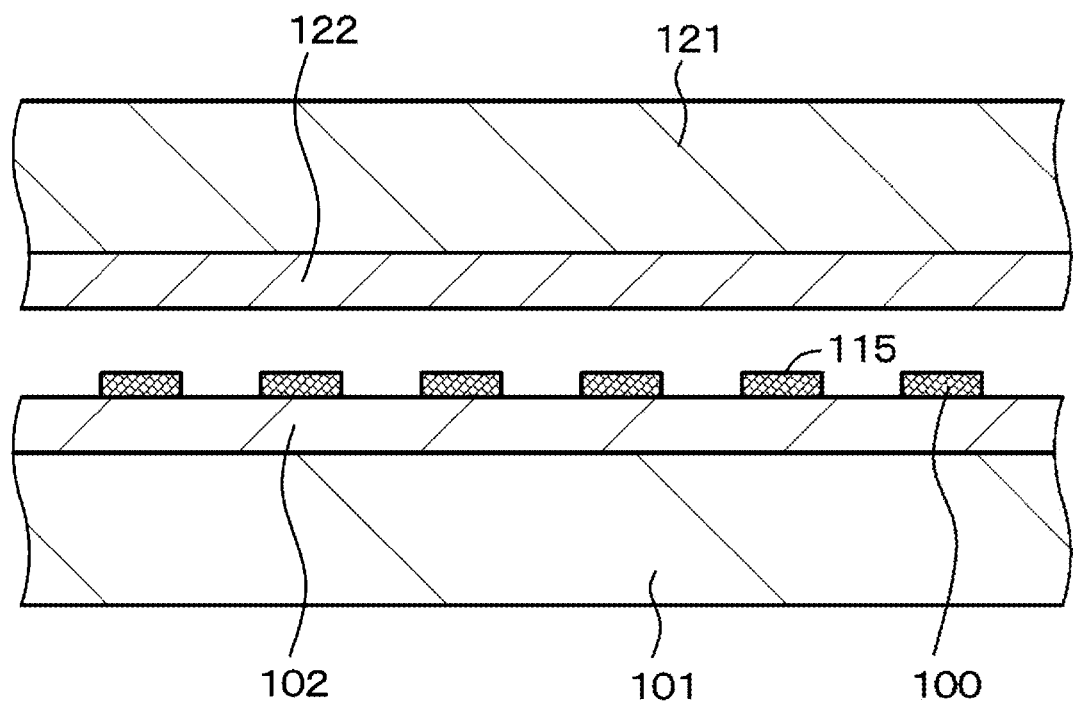

The description has been made assuming that the semiconductor substrate is attached on the mounting substrate according to the fifth embodiment and the sixth embodiment, but the electronic components according to the fifth embodiment and the sixth embodiment are not limited to the form. As illustrated in FIG. 10, the electronic component 10B can be configured such that the semiconductor substrate 51 is attached on the relay substrate 21. The concave parts 24 are formed in the relay substrate 21. The connection part 39 is exposed at the bottom of the concave part 24.

Additionally, the present disclosure can take the following configurations.

[A01] <<Electronic Component Mounting Substrate>>

An electronic component mounting substrate configured of an electronic component, and a mounting substrate mounting the electronic component thereon, in which a concave part is formed on a mounting surface of the electronic component opposite to the mounting substrate, and a connection part is exposed at the bottom of the concave part, and an electronic component attachment part provided on the mounting substrate is soldered to the connection part provided in the electronic component.

[A02]

The electronic component mounting substrate according to [A01], in which the electronic component attachment part is soldered to the connection part provided in the electronic component via a solder bump provided on the electronic component attachment part.

[A03]

The electronic component mounting substrate according to [A01] or [A02], in which a protruded part is provided on the mounting substrate to surround the electronic component attachment part provided on the mounting substrate.

[A04]

The electronic component mounting substrate according to [A01] or [A02], in which a convex part is provided at apart on the mounting substrate where the electronic component is mounted, and the electronic component attachment part is provided on the convex part.

[A05]

The electronic component mounting substrate according to [A01] or [A02], in which a convex part is provided on the mounting substrate to surround a part on the mounting substrate where the electronic component is mounted.

[A06]

The electronic component mounting substrate according to any one of [A01] to [A05], in which the electronic component includes:

a semiconductor substrate;

an electronic device; and a drive circuit formed on the semiconductor substrate and directed for driving the electronic device, the electronic device is provided in an attachment concave part formed at apart on the semiconductor substrate positioned above the drive circuit, and the drive circuit is electrically connected to the electronic device via a connection hole formed in the semiconductor substrate.

[B01] <<Electronic Component>>

An electronic component including:

a semiconductor substrate;

an electronic device; and a drive circuit formed on the semiconductor substrate and directed for driving the electronic device, in which the electronic device is attached in an attachment concave part formed at a part on the semiconductor substrate positioned above the drive circuit, and the drive circuit is electrically connected to the electronic device via a connection hole formed in the semiconductor substrate.

[B02]

The electronic component according to [B01], in which a concave part is formed on the surface of the semiconductor substrate opposite to the surface of the semiconductor substrate where the attachment concave part is formed, and a connection part extending from the drive circuit is exposed at the bottom of the concave part.

[B03]

The electronic component according to [B01] or [B02], in which the electronic device includes a red light emitting diode for emitting red light, a green light emitting diode for emitting green light, and a blue light emitting diode for emitting blue light, the drive circuit is electrically connected to the red light emitting diode via a connection hole formed in the semiconductor substrate, the drive circuit is electrically connected to the green light emitting diode via a connection hole formed in the semiconductor substrate, and the drive circuit is electrically connected to the blue light emitting diode via a connection hole formed in the semiconductor substrate.

[B04]

The electronic component according to [B03], in which the red light emitting diode, the green light emitting diode, and the blue light emitting diode are arranged at the vertices of a regular triangle.

[B05]

The electronic component according to [B04], in which the center of the regular triangle matches with the center of gravity of the drive circuit.

[B06]

The electronic component according to any one of [B01] to [B05], in which a light shielding film is formed in the attachment concave part.

[B07]

The electronic component according to any one of [B01] to [B05], in which a light shielding film is formed on an outer face of the electronic device.

[C01] <<Electronic Component Mounting Method>>

An electronic component mounting method for mounting an electronic component on a mounting substrate, including the steps of:

preparing an electronic component in which a concave part is formed on a mounting surface opposite to the mounting substrate and a connection part is exposed at the bottom of the concave part;

preparing the mounting substrate having an electronic component attachment part provided with a solder bump thereon and applied with flux;

placing the electronic component on the flux such that the concave part of the electronic component is positioned above the electronic component attachment part on the mounting substrate; and then melting the solder bump to solder the electronic component attachment part provided on the mounting substrate to the connection part provided in the electronic component.

[C02]

The electronic component mounting method according to [C01], in which protruded parts are provided on the mounting substrate to surround the electronic component attachment parts provided on the mounting substrate.

[C03]

The electronic component mounting method according to [C01], in which a convex part is provided at the part on the mounting substrate where the electronic component is mounted, and the electronic component attachment parts are provided on the convex part.

[C04]

The electronic component mounting method according to [C01], in which protruded parts are provided on the mounting substrate to surround the part on the mounting substrate where the electronic component is mounted.

[C05]

The electronic component mounting method according to any one of [C01] to [C04], in which an electronic component includes a semiconductor substrate, electronic devices, and a drive circuit formed on the semiconductor substrate and directed for driving the electronic devices, the electronic devices are attached in an attachment concave part formed in a part in the semiconductor substrate positioned above the drive circuit, and the drive circuit is electrically connected to the electronic devices via connection holes formed in the semiconductor substrate.

REFERENCE SIGNS LIST 10A, 10B Electronic component mounting substrate
11 Mounting substrate
11A Part on mounting substrate where electronic component is mounted
12, 12A Electronic component attachment part
13 Solder bump
14 Flux
14A Part of flux positioned above solder bump
15 Protruded part provided on mounting substrate
16 Convex part provided at part on mounting substrate where electronic component is mounted
17 Convex part provided on mounting substrate to surround part on mounting substrate where electronic component is mounted
20, 50 Electronic component
21 Relay substrate
22 First surface of relay substrate
23 Second surface (mounting surface) of relay substrate
24, 54 Concave part
25 Insulative layer
26, 56 Insulative material film
27 Gap between electronic component and mounting substrate
31 Semiconductor integrated circuit chip (IC chip)
57 Transparent resin film
61 Drive circuit
32, 33, 34, 62, 63, 64 Electronic device
35 Wiring
66A Contact part
66B Connection hole
37 Contact hole
38 Wiring
39, 69 Connection part
40 Transfer substrate
41 Adhesive layer
42 Separation groove
51 Semiconductor substrate
51A Attachment concave part
51B Light shielding film
52 First surface of semiconductor substrate
53 Second surface (mounting surface) of semiconductor substrate
100 Light emitting diode
101 Light emitting device manufacturing substrate
102 Underlayer
111 First compound semiconductor layer
112 Second compound semiconductor layer
113 Active layer
114 First electrode
115 Second electrode
121 First temporary fixing substrate
122 Adhesive layer
131 Second temporary fixing substrate
132 Slightly-viscous layer
142 Adhesive layer

The invention claimed is:

1. An electronic component mounting substrate comprising:
an electronic component, and
a mounting substrate mounting the electronic component thereon,
wherein a concave part is formed on a mounting surface of the electronic component opposite to the mounting substrate, and a connection part is exposed at the bottom of the concave part,
wherein an electronic component attachment part provided on the mounting substrate is soldered to the connection part provided in the electronic component, and
wherein the electronic component includes a relay substrate, at least one electronic device wiring in the relay substrate connecting the drive circuit and the electronic device and connecting the drive circuit and the connection part.

2. The electronic component mounting substrate according to claim 1,
wherein the electronic component attachment part is soldered to the connection part provided in the electronic component via a solder bump provided on the electronic component attachment part.

3. The electronic component mounting substrate according to claim 1,
wherein a protruded part is provided on the mounting substrate to surround the electronic component attachment part provided on the mounting substrate.

4. The electronic component mounting substrate according to claim 1,
wherein a convex part is provided at a part on the mounting substrate where the electronic component is mounted, and the electronic component attachment part is provided on the convex part.

5. The electronic component mounting substrate according to claim 1,
wherein a convex part is provided on the mounting substrate to surround a part on the mounting substrate where the electronic component is mounted.

* * * * *